US012606723B2

(12) United States Patent
Fujiwara et al.

(10) Patent No.: US 12,606,723 B2
(45) **Date of Patent: *Apr. 21, 2026**

(54) THERMOSETTING RESIN COMPOSITION, SEMICONDUCTOR DEVICE AND ELECTRICAL/ELECTRONIC COMPONENT

(71) Applicant: KYOCERA Corporation, Kyoto (JP)

(72) Inventors: Masakazu Fujiwara, Warabi (JP); Yu Satake, Yokohama (JP); Yuya Nitanai, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 124 days.

This patent is subject to a terminal disclaimer.

(21) Appl. No.: 18/239,496

(22) Filed: Aug. 29, 2023

(65) Prior Publication Data

US 2023/0411335 A1 Dec. 21, 2023

Related U.S. Application Data

(63) Continuation of application No. 15/283,878, filed on Oct. 3, 2016, now Pat. No. 11,784,153, which is a continuation of application No. PCT/JP2014/001962, filed on Apr. 4, 2014.

(51) Int. Cl.

| | |
|---|---|
| ***H01L 23/00*** | (2006.01) |
| ***C09J 9/02*** | (2006.01) |
| ***H01B 1/22*** | (2006.01) |
| ***H01L 21/52*** | (2006.01) |
| ***H01L 23/373*** | (2006.01) |
| *H10H 20/858* | (2025.01) |

(52) U.S. Cl.

CPC ................ *H01L 24/29* (2013.01); *C09J 9/02* (2013.01); *H01B 1/22* (2013.01); *H01L 21/52* (2013.01); *H01L 23/3737* (2013.01); *H01L 24/26* (2013.01); *H01L 24/83* (2013.01); *H01L 2224/2929* (2013.01); *H01L 2224/29339* (2013.01); *H01L 2224/2939* (2013.01); *H01L 2224/29391* (2013.01); *H01L 2224/29499* (2013.01); *H01L 2224/83024* (2013.01); *H01L 2224/8321* (2013.01); *H01L 2224/8384* (2013.01); *H01L 2224/83862* (2013.01); *H01L 2924/0665* (2013.01); *H01L 2924/10272* (2013.01); *H01L 2924/1033* (2013.01); *H01L 2924/12041* (2013.01); *H01L 2924/3511* (2013.01); *H10H 20/8581* (2025.01)

(58) Field of Classification Search

None

See application file for complete search history.

(56) References Cited

U.S. PATENT DOCUMENTS

| | | | |
|---|---|---|---|
| 7,901,502 | B2 | 3/2011 | Barthel et al. |
| 2003/0091751 | A1 | 5/2003 | Tsuruta |
| 2004/0146642 | A1 | 7/2004 | Josephy |
| 2008/0078977 | A1 | 4/2008 | Hashiba |
| 2008/0272344 | A1 | 11/2008 | Jiang |
| 2009/0104457 | A1 | 4/2009 | Carroll |
| 2010/0167045 | A1 | 7/2010 | Schultes |
| 2011/0186340 | A1 | 8/2011 | Kuramoto et al. |
| 2011/0313082 | A1 | 12/2011 | Popp |
| 2012/0007124 | A1 | 1/2012 | Hata |
| 2012/0232206 | A1 | 9/2012 | Wu |
| 2013/0049148 | A1 | 2/2013 | Hang |
| 2013/0081759 | A1 | 4/2013 | Endoh et al. |
| 2015/0104625 | A1 | 4/2015 | Shiozawa |
| 2015/0191610 | A1 | 7/2015 | Matsushita |
| 2015/0218391 | A1 | 8/2015 | Takahashi |

FOREIGN PATENT DOCUMENTS

| | | | |
|---|---|---|---|
| CN | 102958631 | A | 3/2013 |
| EP | 1944797 | A1 | 7/2008 |
| EP | 2581156 | A1 | 4/2013 |
| JP | 07-126489 | A | 5/1995 |
| JP | 07-192527 | A | 7/1995 |
| JP | H-1017841 | A | 1/1998 |
| JP | 2005-113059 | A | 4/2005 |
| JP | 2006-086273 | A | 3/2006 |
| JP | 2007-270130 | A | 10/2007 |
| JP | 2010-121124 | A | 6/2010 |

(Continued)

OTHER PUBLICATIONS

Noh ey al., Heat-Resistant Microporous Ag Die-Attach Stricture for Wide Band-Gap Power Semiconductors, Materials 2018, 11, 2531, 10 pgs., (Year 2018).

Extended European Search Report, European Patent Application No. 14888419.0, Oct. 11, 2017, 7 pgs.

Japanese Office Action with English concise explanation, Japanese Patent Application No. 2016-511170, Nov. 21, 2017, 9 pgs.

Notice of Transmittal of Translation if the International Preliminary Report on Patentability (PCT/IB/388), PCT/JP2014/001962, Oct. 4, 2016, 1 pg.

(Continued)

*Primary Examiner* — Samir Shah

(74) *Attorney, Agent, or Firm* — Volpe Koenig

(57) ABSTRACT

There are provided a thermosetting resin composition for semiconductor bonding and a thermosetting resin composition for light emitting device which have high thermal conductivity and an excellent heat dissipation property and are capable of reliable pressure-free bonding of a semiconductor element and a light emitting element to a substrate. A thermosetting resin composition comprising: (A) silver fine particles ranging from 1 nm to 200 nm in thickness or in minor axis; (B) a silver powder having an average particle size of more than 0.2 μm and 30 μm or less; (C) resin particles; and (D) a thermosetting resin, wherein an amount of the resin particles (C) is 0.01 to 1 part by mass and an amount of the thermosetting resin (D) is 1 to 20 parts by mass, to 100 parts by mass being a total amount of the silver fine particles (A) and the silver powder (B).

15 Claims, No Drawings

(56) References Cited

FOREIGN PATENT DOCUMENTS

| | | | |
|---|---|---|---|
| JP | 2011-094146 | A | 5/2011 |
| JP | 2011-141973 | A | 7/2011 |
| JP | 2011-240406 | A | 12/2011 |
| JP | 2012-036481 | A | 2/2012 |
| TW | 201143960 | A1 | 12/2011 |
| TW | 201213473 | A1 | 4/2012 |
| WO | 2011/155615 | A1 | 12/2011 |
| WO | 2013/161966 | A1 | 10/2013 |
| WO | 2014/038331 | A1 | 3/2014 |
| WO | 2014/038611 | A1 | 3/2014 |

OTHER PUBLICATIONS

International Preliminary Report on Patentability (PCT/IB/373), PCT/JP2014/001962, Oct. 4, 2016, 1 pg.

Written Opinion of the International Searching Authority (PCT/IS/237), PCT/JP2014/001962, Oct. 4, 2016, 6 pgs.

THERMOSETTING RESIN COMPOSITION, SEMICONDUCTOR DEVICE AND ELECTRICAL/ELECTRONIC COMPONENT

This application is a continuation of U.S. patent application Ser. No. 15/283,878, filed on Oct. 3, 2016, which is a continuation of International Application No. PCT/JP2014/001962, filed on Apr. 4, 2014; the entire content of which is incorporated herein by reference.

FIELD

The present invention relates to a thermosetting resin composition, and a semiconductor device and an electrical/electronic component that are manufactured using the thermosetting resin composition.

BACKGROUND

With the increase of the capacity and processing speed and the advancement of wiring miniaturization of semiconductor products, heat generated during the operation of the semiconductor products has become a significant problem, and what is called thermal management that removes heat from the semiconductor products has become a more important task. For this purpose, a method of attaching a heat dissipation member such as a heat spreader or a heat sink to the semiconductor product has been commonly adopted, and a material for bonding the heat dissipation member is itself required to have higher thermal conductivity.

To increase efficiency of the thermal management, some type of semiconductor products adopts a method in which a heat spreader is attached to a semiconductor element itself or to a die pad portion of a lead frame to which the semiconductor element is bonded, or a method in which a die pad portion is exposed to a package surface to function as a heat dissipation plate.

Further, in some case, a semiconductor element is bonded to an organic substrate having a heat dissipation mechanism such as a thermal via. In this case as well, a material which bonds the semiconductor element is required to have high thermal conductivity. Further, with the recent brightness increase of white light emitting LEDs, they have come in wide use as backlight illumination of full-color liquid crystal displays and lighting fixtures such as ceiling lights and downlights. Supplying higher currents to light emitting elements in accordance with an increase of their power has created problems that an adhesive which bonds the light emitting element and a substrate discolors due to heat, light, and the like, or an electrical resistance value changes with time. In particular, a method in which the joining relies completely on adhesion strength of an adhesive involves a concern about a fatal problem that the joining material loses the adhesion strength at a solder melting point to peel off during solder-mounting of an electronic component, resulting in non-lighting. Further, performance sophistication of the white light emitting LED leads to an increase of heat generation of a light emitting element chip, and accordingly the structure of LED and members used for this are required to have an improved heat dissipation property.

Especially owing to the recent active development of power semiconductor devices using wide band gap semiconductors such as silicon carbide (SiC) and gallium nitride which are small in power loss, elements themselves come to have higher heat resistance and thus are capable of operating at a high temperature of 250° C. or higher with a large current. However, in order to exhibit this property, they need to efficiently dissipate operation heat, and accordingly a joining material excellent in long-term high-temperature heat resistance as well as electrical conductivity and a heat transfer property is required.

High thermal conductivity is thus required of materials (a die attach paste, a material for heat dissipation member bonding, and the like) used to bond members of semiconductor devices and electrical/electronic components. In addition, these materials need to withstand reflowing at the time of mounting a product on a substrate, and further sometimes are required to perform large-area bonding and accordingly need to have a low stress property for preventing a warp ascribable to a difference in coefficient of thermal expansion between constituent members.

Here, to obtain an adhesive having high thermal conductivity, it is usually necessary to use, as a filler, a metal filler such as a silver powder or a copper powder, or a ceramic filler such as aluminum nitride or boron nitride, and disperse the filler with a higher content in an organic binder. This, however, results in an increase of a high modulus of elasticity of a cured product, which has made the cured product difficult to have both good thermal conductivity and good reflow resistance (property of not easily peeling off after the aforesaid reflowing).

On the other hand, as a choice for a joining method that can satisfy these requirements, a joining method using silver nanoparticles enabling the joining under a lower-temperature condition than bulk silver has recently been drawing attention.

SUMMARY

The joining using the silver nanoparticles, however, has problems of damage possibly given to an element because it usually requires pressurization and heating at the time of the joining, the occurrence of a sintering void in a case of pressure-free joining using volume shrinkage which occurs when the silver nanoparticles sinter, and poor versatility due to a need for an oxidizing atmosphere for the device.

Here, the sintering void is thought to occur because, when the thermosetting resin composition between a substrate such as a lead frame and a chip is thermally cured, the sintering of the silver particles progresses before a solvent component or a dispersing agent for the nanoparticles completely volatilizes, so that the solvent component or the dispersing agent for the nanoparticles remains. The solvent component or the dispersing agent for the nanoparticles which does not completely volatilize and remains on a junction layer may cause a crack due to an impact at the time of the reflowing.

Further, when the resin composition is thermally cured, the volume of the resin composition shrinks due to the volatilization of the solvent component or the dispersing agent for the nanoparticles, or the sintering further progresses under the high-temperature environment, and due to the movement of the silver caused by the sintering shrinkage, a strain may remain in the chip, which is liable to cause the deformation of the chip especially when the chip to be mounted is thin.

Further, since organic matters covering the surfaces of the silver nanoparticles are removed by oxidative decomposition, it is essential that an atmosphere when a joined body is formed using the silver nanoparticles is an oxidizing atmosphere such as the atmospheric air. Accordingly, in a case where a substrate of copper or the like is used, the substrate itself oxidizes, which may lead to an adhesion failure of a sealing material, and this is thought to have a significant influence especially on a microscopic joined body. Therefore, if a joining material exhibiting sufficient joining strength under an inert atmosphere such as nitrogen can be provided, the oxidation of the substrate and so on can be prevented and it is also possible to remarkably widen the application field and possibility of the joining material.

Therefore, it is an object of the present invention to provide a resin composition having excellent thermal conductivity, an excellent low stress property, a good bonding property, and reflow peeling resistance, and to provide a semiconductor device and an electrical/electronic component that use the resin composition as a bonding material to thereby have excellent reliability.

The thermosetting resin composition of the present invention comprising: (A) silver fine particles ranging from 1 nm to 200 nm in thickness or in minor axis; (B) a silver powder other than the silver fine particles (A), the silver powder having an average particle size of more than 0.2 μm and 30 μm or less; (C) resin particles; and (D) a thermosetting resin, wherein the resin particles (C) contain a silicone powder having an average particle size of 0.5 to 50 μm and/or have a compressive elastic modulus of 200 to 3000 $N/mm^2$ and a compression recovery rate of 30% or less, wherein an amount of the resin particles (C) is 0.01 to 1 part by mass and an amount of the thermosetting resin (D) is 1 to 20 parts by mass, to 100 parts by mass being a total amount of the silver fine particles (A) and the silver powder (B).

In the thermosetting resin composition, the silver fine particles (A) preferably include at least one kind out of plate-shaped silver fine particles (A1) having a median particle size of 0.3 to 15 μm and a thickness of 10 to 200 nm and spherical silver fine particles (A2) having an average particle size of 10 to 200 nm, and preferably the silver fine particles (A) self-sinter at 100° C. to 250° C. Further, the resin particles (C) are preferably particles having an average particle size of 0.5 to 50 μm. Further, a mass ratio of the component (A) and the component (B) is preferably 10:90 to 90:10.

In the semiconductor device of the present invention, a semiconductor element is bonded on a substrate, using the above-described resin composition of the present invention as a die attach material.

Further, in the electrical/electronic component of the present invention, a heat dissipation member is bonded to a heat generation member, using the above-described resin composition of the present invention as a material for heat dissipation member bonding.

According to the thermosetting resin composition of the present invention, since its cured product has excellent thermal conductivity, an excellent low stress property, a good bonding property, and excellent reflow peeling resistance, the thermosetting resin composition is suitable as a die attach paste for element bonding or a material for heat dissipation member bonding. Further, according to the thermosetting resin composition of the present invention, its cured product has less void, and by using resin particles having predetermined properties, adhesion of a joined body can be improved and the occurrence of strain and deformation of a chip can be reduced.

Further, the use of the above-described thermosetting resin composition as these bonding materials makes it possible to provide a semiconductor device and an electrical/electronic component excellent in reliability.

DETAILED DESCRIPTION

As described above, the thermosetting resin composition of the present invention comprising: (A) silver fine particles ranging from 1 nm to 200 nm in thickness or in minor axis; (B) a silver powder other than the silver fine particles (A), the silver powder having an average particle size of more than 0.2 jam and 30 jam or less; (C) resin particles; and (D) a thermosetting resin.

With this composition, when the silver fine particles (A) and the silver powder (B) are sintered, a firing void occurs less owing to a "physical barrier effect" that restricts sintering routes of the silver particles, and a chip suffers less deformation and strain owing to plastic deformation. Further, the resin composition of the present invention is capable of pressure-free joining and is also excellent in adhesiveness. Accordingly, a semiconductor device and an electrical/electronic component manufactured using the thermosetting resin composition as a die attach paste or a material for heat dissipation member bonding are excellent in reflow resistance.

The present invention will be hereinafter described in detail.

The silver fine particles (A) used in the present invention are not limited to particular ones, provided that their thickness or minor axis is 1 to 200 nm, and those having a plate shape, a flake shape, a scale shape, a branch shape, a rod shape, a wire shape, a spherical shape, or the like are usable. Here, the plate-shaped, flake-shaped, or scale-shaped silver fine particles need to have a thickness satisfying the aforesaid range, and the branch-shaped, rod-shaped, wire-shaped, or spherical shaped silver fine particles need have the shortest axis of the diameters satisfying the aforesaid range. Further, the silver fine particles(A) preferably include at least one kind of plate-shaped silver fine particles (A1) and spherical silver fine particles (A2) out of these, and those using a combination of the component (A1) and the component (A2) are more preferable.

The plate-shaped silver fine particles (A1) used in the present invention are plate-shaped thin particles having a uniform thickness, which are obtained through the growth of one metal crystal plane to a large size, unlike spherical nanoparticles, and their examples include well-known plate-shaped silver fine particles that can be compounded in a resin composition. In general, they have a micron order size, an about several nanometer thickness, and a shape of a triangle plate, a hexagonal plate, a truncated triangle plate, or the like. Further, their upper surfaces are preferably widely covered with planes.

Silver fine particle-containing resin composition which contains the plate-shaped silver fine particles (A1) is higher in thermal conductivity than an ordinary one filled only with a silver powder, is smaller in internal stress than that using spherical silver nano-fine particles since the plate-shaped silver fine particles (A1) sinter mainly in the thickness direction, and also is a joining material excellent in reflectivity owing to high orientation of the silver fine particles. Further, since the plate-shaped silver fine particles (A1) are less susceptible to an influence of the presence/absence of oxygen unlike ordinary silver fine particles (silver nanoparticles), they are capable of sintering under an atmosphere of inert gas such as nitrogen.

A median particle size of the plate-shaped silver fine particles (A1) is preferably 0.3 to 15 μm. With the median particle size being within this range, their dispersibility in the resin component can be improved, and a problem of nozzle clogging and a strain of a chip during the assembly of a semiconductor element can be reduced. Here, the median particle size refers to a 50% integrated value (50% particle size) in a volume-based particle size distribution curve which is obtained through measurement with a laser diffraction particle size analyzer. Further, their thicknesses preferably fall within 10 to 200 nm, and these thicknesses are measured through data processing of observation images obtained by a transmission electron microscope (TEM) or a scanning electron microscope (SEM). Further, an average thickness of these thicknesses is preferably within the aforesaid range. This average thickness is calculated as a number average thickness in the following manner.

A thickness range measured from the observation images of 50 to 100 pieces of the plate-shaped silver fine particles (largest thickness: ×1, smallest thickness: xn+1) is n-divided, and each thickness section is defined as [xj, xj+1] (j=1, 2, . . . , n). The division in this case is equisection on a logarithmic scale. Further, a typical thickness in each of the thickness sections is expressed by the following expression based on the logarithmic scale.

$$\frac{\log_{10}x_j + \log_{10}x_{j-1}}{2}.$$

Further, let r j (j=1, 2, . . . , n) be a relative amount (difference %) corresponding to the section $[x_j, x_{j+1}]$ and let the total value of all the sections be 100%, an average value μ can be calculated on the logarithmic scale by the following expression.

$$\mu = \frac{1}{100}\sum_{j=1}^{n} r_j\left(\frac{\log_{10}x_j + \log_{10}x_{i+1}}{2}\right)$$

Since this μ is a numerical value on the logarithmic scale and does not have a unit as the thickness, $10^\mu$ is found, that is, 10 raised to the $\mu^{th}$ power is calculated in order to return it to a value having a thickness unit. This $10^\mu$ is defined as the number average thickness.

Further, the longer side in a perpendicular direction to the thickness direction is preferably within a range of 8 to 150 times, more preferably 10 to 50 times, as large as the thickness. Further, the shorter side in a perpendicular direction to the thickness direction is preferably within a range of 1 to 100 times, more preferably 3 to 50 times, as large as the thickness.

The plate-shaped silver fine particles (A1) are self-sinterable at 100 to 250° C. The silver fine particles containing the silver fine particles thus self-sintering at 100 to 250° C. have improved flowability at the time of thermal curing, resulting in an increase of contact points between the silver fine particles, and in addition, an increase of the areas of the contact points, leading to a great improvement of electrical conductivity. Accordingly, a sintering temperature of the plate-shaped silver fine particles is more preferably 100 to 200° C. Note that “self-sinterable” mentioned here means “sinter when heated at a temperature lower than a melting point” without a pressure being applied, or without an additive or the like being added.

Further, the plate-shaped silver fine particles (A1) are preferably monocrystalline. The monocrystalline structure can ensure electrical conductivity in low-temperature curing.

The plate-shaped silver fine particles (A1) are oriented in a horizontal direction in a coating film and have a larger number of contact points, thereby capable of improving electrical conductivity. This is because, at the time of the thermal curing, they are naturally oriented in the coating film so as to be stacked in the thickness direction due to a compression effect by the weight of the chip and due to a volume decrease effect that the volume of the resin composition shrinks as a result of a reduction of its volatile component and its curing shrinkage, so that the contact points between the silver fine particles can be large.

Further, the surfaces of the plate-shaped silver fine particles (A1) can be surface-treated as required, and for example, to improve compatibility, stearic acid, palmitic acid, hexanoic acid, oleic acid, or the like is usable.

Examples of the above-described plate-shaped silver fine particles (A1) include M612 (brand name; median particle size 6 to 12 μm, particle thickness 60 to 100 nm, melting point 250° C.), M27 (brand name; median particle size 2 to 7 μm, particle thickness 60 to 100 nm, melting point 200° C.), M13 (brand name; median particle size 1 to 3 μm, particle thickness 40 to 60 nm, melting point 200° C.), and N300 (brand name; median particle size 0.3 to 0.6 nm, particle thickness 50 nm or less, melting point 150° C.) which are manufactured by Tokusen Kogyo Co., Ltd. These kinds of plate-shaped silver fine particles each may be used alone or a combination of these may be used. Especially to improve a filling factor, the use of the combination of relatively large silver fine particles such as M27 or M13 and those with a small particle size such as N300, out of the aforesaid plate-shaped silver fine particles, is also preferable.

The particle sizes of the spherical silver fine particles (A2) used in the present invention fall within 10 to 200 nm. In the spherical silver fine particles (A2), coating layers of an organic compound are ordinarily provided on metal surfaces of the silver fine particles, or the silver fine particles are dispersed in an organic compound. Such forms can prevent the direct contact between the metal surfaces of the contained silver fine particles to thereby hinder the formation of a mass in which the silver fine particles aggregate, and can keep the silver fine particles separately dispersed. The particle sizes are measured through data processing of observation images obtained by a transmission electron microscope (TEM) or a scanning electron microscope (SEM). Further, the average particle size of the spherical silver fine particles (A2) is preferably within the aforesaid range. This average particle size is calculated as a number average particle size of the particle sizes measured from the observation images of 50 to 100 pieces of the spherical silver fine particles. As this number average particle size, an average value may be calculated, as in the calculation of the aforesaid average thickness.

As the organic compound of the coating layers on the surfaces of the silver fine particles or the organic compound in which the silver fine particles are dispersed, an organic compound with a 20000 molecular weight or less having nitrogen, carbon, and oxygen as constituent elements, specifically, an organic compound containing a functional group such as an amino group or a carboxyl group is used.

An example of the organic compound containing the carboxyl group used here is one kind of organic compound or more with a 110 to 20000 molecular weight selected from organic carboxylic acids, and examples thereof include carboxylic acids such as hexanoic acid, heptanoic acid, octanoic acid, nonanoic acid, decanoic acid, undecanoic acid, dodecanoic acid, tetradecanoic acid, eicosanoic acid, docosanoic acid, 2-ethylhexanoic acid, oleic acid, linolic acid, linolenic acid, and dipropionic acid-terminated polyethylene oxide. Further, as the organic compound, a carboxylic acid derivative of any of the aforesaid carboxylic acids is also usable.

Further, as the organic compound containing the amino group used here, alkylamine is usable, and examples thereof include: primary amines such as butylamine, methoxyethylamine, 2-ethoxyethylamine, hexylamine, octylamine, 3-butoxypropylamine, nonylamine, dodecylamine, hexadodecylamine, octadecylamine, cocoamine, tallow amine, tallow amine hydroxide, oleylamine, laurylamine, stearylamine, and 3-aminopropyltriethoxysilane; secondary amines such as dicocoamine, dihydrogenated tallow amine, and distearylamine; tertiary amines such as dodecyldimethylamine, didodecylmonomethylamine, tetradecyldimethylamine, octadecyldimethylamine, cocodimethylamine, dodecyl tetradecyldimethylamine, and trioctylamine; and besides, diamines such as naphthalenediamine, stearylpropylenediamine, octamethylenediamine, nonandiamine, diamine-terminated polyethylene oxide, triamine-terminated polypropylene oxide, and diamine-terminated polypropylene oxide.

It is not preferable that the molecular weight of the organic compound which covers the spherical silver fine particles (A2) or in which the spherical silver fine particles (A2) are dispersed is over 20000, since such an organic compound is difficult to detach from the metal particle surfaces and thus may remain in the cured product after the paste is fired, and as a result may deteriorate electrical conductivity. Therefore, the molecular weight of the organic compound covering the surfaces is preferably small from this viewpoint. Further, the molecular weight is preferably 50 or more. If the molecular weight is less than 50, storage stability of the silver particles may deteriorate.

In the spherical silver fine particles (A2), a mass ratio of the silver fine particles and the organic compound covering them or having them dispersed therein is preferably 90:10 to 99.5:0.5. In this case, when the mass ratio of the organic compound to the silver fine particles is small, the aggregation easily occurs, whereas, when it is large, the organic compound may remain in the cured product after the firing to deteriorate electrical conductivity and thermal conductivity as a result.

Under the above condition, the silver particles including the silver powder (B), which will be described later, can have an improved fill factor and can also have low-temperature sinterability. The co-use of the aforesaid plate-shaped silver fine particles (A1) and the spherical silver fine particles (A2) as the silver fine particles (A) can improve the properties such as the fill factor and the low-temperature sinterability of the silver particles.

The silver powder (B) used in the present invention is a silver powder having an average particle size of more than 0.2 μm and 30 μm or less, and may be a silver powder as an organic filler which is ordinarily added in a resin adhesive to impart electrical conductivity. When a resin composition containing micron-order silver particles like the silver powder (B) in addition to the aforesaid silver fine particles being the component (A) is used for bonding an element such as a semiconductor element and a support substrate, joining strength can be more improved. Further, examples of the shape of the silver particles used here include a flake shape, a scale shape, a branch shape, a rod shape, a wire shape, and a spherical shape. Note that the component (B) does not contain silver fine particles corresponding to the component (A).

Note that the average particle size mentioned here refers to a 50% integrated value (50% particle size) in a volume-based particle size distribution curve which is obtained through measurement with a laser diffraction particle size analyzer.

With the total amount of the component (A) and the component (B) being 100, a mass ratio of the component (A):the component (B) is preferably 10:90 to 90:10, and more preferably 10:90 to 50:50. If a ratio of the component (A) to the component (B) is too low, it is difficult to ensure high thermal conductivity, and if the ratio of the component (A) is too high, a void may occur in the cured product, or workability may worsen due to a stringing phenomenon ascribable to an increase of thixotropy at the time of the mounting.

The resin particles (C) used in the present invention are not limited to particular ones and any resin particles are usable. An average particle size of the resin particles (C) is preferably 0.5 to 50 μm, more preferably 0.8 to 20 μm, still more preferably 0.8 to 10 μm, and especially preferably 0.8 to 5 μm.

With the average particle size of the resin particles (C) being within this range, workability and joining strength are not impaired, and owing to the "physical barrier effect" of restricting the sintering routes of the silver particles, it is possible to impede the progress of the sintering of the silver fine particles under a high-temperature environment. This is preferable since the occurrence of a firing void is reduced, leading to excellent reflow peeling resistance and heat cycle resistance. Further, this is preferable since thermal shock resistance can be improved by their stress relaxation ability.

Incidentally, the resin particles (C) having a small average particle size, for example, 20 μm or less easily disperse uniformly in a sintered junction layer, making it possible to more effectively impede the progress of the sintering. Here, the average particle size of the resin particles (C) refers to a number average particle size calculated from particle size distribution measured by a laser diffraction particle size analyzer. As this number average particle size, an average value may be calculated as in the calculation of the aforesaid average thickness.

A material of the resin particles (C) is not limited to a particular one, provided that they are made of the resin as described above, but a silicon powder or a cross-linked polymer is suitably usable, for instance. Further, the shape of the resin particles (C) is not limited to a particle one, provided that they can impede the progress of the sintering, and a spherical shape, an indeterminate shape, or the like is used. To effectively impede the progress of the sintering, it is preferably compounded in a dispersed manner in the thermosetting resin (D), and from this point of view, their shape is preferably the spherical shape having good dispersibility.

Examples of the silicone powder include silicone rubber particles having a structure in which straight-chain dimethylpolysiloxanes are cross-linked, silicone resin particles being a polyorganosilsesquioxane cured product having a structure in which siloxane bonds are cross-linked in a three-dimensional net form, and silicone composite particles in which surfaces of silicone rubber particles are coated with silicone resin. In view of heat resistance and dispersibility, a silicone resin or silicon composite particles are more preferable.

Specific examples of a commercially available silicon powder include silicone composite powders (KMP-600, KMP-601, KMP-602, KMP-605, X-52-7030), silicone rubber powders (KMP-597, KMP-598, KMP-594, X-52-875), silicone resin powders (KMP-590, KMP-701, X-52-854, X-52-1621) which are manufactured by Shin-Etsu Chemical Co., Ltd., and any of these may be used alone or a combination of two kinds or more of these may be used.

Here, in a case where the silicone powder is used, its average particle size is preferably 0.5 to 10 μm, and more preferably 0.8 to 5 μm. The silicone powder having the average particle size within this range exhibits an effective "physical barrier effect", so that a resin composition free from a firing void is obtained. This average particle size refers to a number average particle size obtained through measurement with a laser diffraction particle size analyzer.

Examples of the cross-linked polymer include divinylbenzene, a methyl methacrylate resin (PMMA), an ethyl methacrylate resin (PEMA), butyl methacrylate resin (PBMA), a methyl methacrylate-ethyl methacrylate copolymer, and a mixture of these, and among all, a divinylbenzene cross-linked polymer and a methyl methacrylate resin which are excellent in heat resistance and stability are preferable.

Further, the surfaces of the resin particles (C) may be coated with metal such as gold or silver. If the resin particles are metal-coated, a "termination effect" that stops the progress of the sintering of the silver fine particles at an instant when it reaches the metal coating on the surfaces of the resin particles can be expected in addition to the "physical barrier effect" of restricting the sintering routes of the silver fine particles. This is preferable since the "termination effect" makes it possible to impede the progress of the sintering of the silver fine particles under the high-temperature environment, and thus the occurrence of the firing void can be reduced, leading to excellent reflow peeling resistance and heat cycle resistance. Examples of the metal-coated resin particles include "Micropearl AU series" (brand name) manufactured by Sekisui Fine Chemical Co., Ltd.

Further, in view of improvement of adhesion in addition to the reduction of the occurrence of the void, the resin particles (C) of the present invention are preferably resin particles having properties of a 200 to 3000 N/mm$^2$ compressive elastic modulus (30% K value) and a 5% to 40% compression recovery rate. As the properties of the resin particles, more preferably, the compressive elastic modulus (30% K value) is 200 to 2000 N/mm$^2$ and the compression recovery rate is 5% to 30%.

When the compressive elastic modulus and the compression recovery rate are within the aforesaid ranges, the occurrence of the void can be reduced, and in addition, adhesion of the resin with the silver particles, the chip, or the like is improved at the time of the thermal curing of the resin composition and the sintering, so that a resin composition capable of reducing the strain or the deformation of the chip at the time of the mounting or at the time when the high-temperature is kept is obtained.

If the compressive elastic modulus (30% K value) of the aforesaid resin particles is less than 200 N/mm$^2$, a degree of cross-linking becomes insufficient, heat resistance becomes low, and the deformation is likely to occur due to the influence of volume shrinkage at the time of the sintering, which may decrease the effect of reducing the deformation of the chip. Further, if the compressive elastic modulus is over 3000 N/mm$^2$, they cannot follow the sintering shrinkage when the composition cures, which may lead to the deterioration of adhesion or the occurrence of the void.

If the compression recovery rate of the aforesaid resin particles is less than 5%, they cannot follow the sintering shrinkage when the composition cures, and thus the sintering void may remain or adhesion may lower. On the contrary, if the compression recovery rate is over 40%, they cannot follow the volume shrinkage at the time of the sintering and thus may protrude from the resin composition, which may lead to the strain or the deformation of the chip.

The compressive elastic modulus (30% K value) is defined by the following mathematical expression (1).

$$\text{compressive elastic modulus(30\% } K \text{ value)} = (3/\sqrt{2}) \cdot F \cdot S^{-3/2} \cdot R^{-1/2} \quad (1)$$

Here, F represents a load value (N) in 30% compressive deformation, S represents compressive displacement (mm) in the 30% compressive deformation, and R represents the radius (mm) of the resin particles.

The compressive elastic modulus (30% K value) is measured as follows.

The resin particles are compressed on a smooth end surface of a diamond column with a diameter of 50 μm under the condition with a compression rate of 2.6 mN/second and a maximum test load of 10 g, using a micro compression testing machine (for example, Shimadzu Dynamic Ultra Micro Hardness Tester DUH-W201 [manufactured by Shimadzu Corporation]), the load value (N) in the 30% compressive deformation and the displacement (mm) in the 30% compressive deformation are measured, and the compressive elastic modulus is calculated by the above mathematical expression (1).

The compression recovery rate is defined by the following mathematical expression (2).

$$\text{compression recovery rate (\%)} = [(L1 - L2)/L1] \times 100 \quad (2)$$

The compression recovery rate is a shape recovery rate from a compressive deformation state under a 20° C. atmosphere, and is measured as follows according to the method described in JP-A H07-95165(KOKAI). The spherical resin particles are compressed on a smooth end surface of a diamond column with a diameter of 50 μm under the condition with a compression rate of 2.6 mN/second and a maximum test load of 10 g, using a micro compression testing machine (for example, Shimadzu Dynamic Ultra Micro Hardness Tester DUH-W201 [manufactured by Shimadzu Corporation]), and the compression recovery rate is found as a ratio (%) of the total deformation amount (L1) and a plastic deformation amount (L2) found from a hysteresis curve of a load and a deformation amount.

Such resin particles are preferably the aforesaid cross-linked polymer. They are further preferably spherical particles since, in the spherical particles, compression recovery can uniformly function in all the directions. Further, the use of the cross-linked polymer enables the control of the size of the resin particles by the synthesis condition and thus facilitates manufacturing spherical particles with a desired size. This case is preferable also because there is no need to subject the resin particles to a post-process after their synthesis.

Further, for the purpose of reducing the deformation and the strain of the chip when the semiconductor chip is mounted on the support substrate, in addition to the aforesaid impeding of the progress of the sintering, particles having an average particle size of 10 to 50 μm are preferably used as the resin particles (C). In this case, the resin particles used to reduce the deformation and strain of the chip are preferably resin particles having an average particle size larger than the average particle size of the silver powder (B), and are more preferably resin particles having an average particle size larger than the largest particle size of the silver powder (B). Further, in order to reduce the deformation and the strain of the chip, they are preferably monodisperse particles having high particle uniformity in addition to the compressive elastic modulus and the compression recovery rate within the aforesaid ranges. In this specification, the monodisperse particles refer to particles having a uniform particle size and to particles whose coefficient of variation (CV value) is 30% or less. This coefficient of variation (CV value) is preferably 20% or less, more preferably 10% or less.

In order to impede the progress of the sintering, the resin particles (C) are preferably relatively small particles having an average particle size smaller than the average particle size of the silver powder (B), and in order to reduce the strain of the chip, they are preferably relatively large particles having an average particle size larger than the average particle size of the silver powder (B). Therefore, in order to obtain the both effects, two kinds of particles different in average particle size can also be co-used as the resin particles (C). In the case where two kinds of resin particles different in size are thus used, the resin particles with a large average particle size and the resin particles with a small average particle size are preferably co-used at a mass ratio within a range of 10:1 to 1:10.

An amount of the resin particles (C) in the composition is 0.01 to 1 part by mass to 100% being the total amount of the silver fine particles as the component (A) and the silver powder as the component (B). It is not preferable that the component (C) is less than 0.01 parts by mass, since the impeding of the sintering progress of the silver particles does not function and thermal shock resistance also deteriorates. Further, if it is over 1 part by mass, increased viscosity deteriorates workability, and in addition, interface joining strength deteriorates in accordance with a volume increase of the organic component, and accordingly it is not possible to sufficiently ensure high thermal conductivity, leading to deterioration of the heat dissipation property.

The thermosetting resin (D) used in the present invention is not limited to a particular one and any thermosetting resin ordinarily used as an adhesive is usable. Among them, a liquid resin is preferable, and a resin that is in a liquid form at room temperature (25° C.) is more preferable. Examples of the thermosetting resin (D) include a cyanate resin, an epoxy resin, a radical polymerizable acrylic resin, and a maleimide resin. The resin composition containing the thermosetting resin (D) can be a bonding material (paste) with a moderate viscosity. Further, the resin composition containing the thermosetting resin (D) increases in temperature due to a reaction heat when the thermosetting resin (D) cures, to produce an effect of promoting sinterability of the silver fine particles, and thus is preferable.

The cyanate resin is a compound having a —NCO group in a molecule, and is a resin that forms a three-dimensional net structure to cure when the —NCO group reacts by heating. Specific examples thereof include 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)methane, bis(3,5-dimethyl-4-cyanatophenyl)methane, 2,2-bis(4-cyanatophenyl)propane, 2,2-bis(3,5-dibromo-4-cyanatophenyl)propane, bis(4-cyanatophenyl) ether, bis(4-cyanatophenyl)thioether, bis(4-cyanatophenyl) sulfone, tris(4-cyanatophenyl)phosphite, tris(4-cyanatophenyl)phosphate, and cyanates obtained through a reaction of a novolac resin and halogenated cyan. Further, a prepolymer having a triazine ring, which is formed through trimerization of cyanate groups of these polyfunctional cyanate resins, is also usable. This prepolymer is obtained through polymerization of the aforesaid polyfunctional cyanate resin monomers, using, for example, acid such as mineral acid or Lewis acid, a base such as sodium alcoholate or tertiary amine, or salt such as sodium carbonate as a catalyst.

As a curing accelerator for the cyanate resin, a generally known one is usable. Its examples include organic metal complexes such as zinc octylate, tin octylate, cobalt naphthenate, zinc naphthenate, and acetylacetone iron, metallic salts such as aluminum chloride, tin chloride, and zinc chloride, and amines such as triethylamine and dimethylbenzylamine, but the curing accelerator is not limited to these. One kind or a mixture of two kinds of more of these curing accelerators can be used. Further, the cyanate resin may be used together with another resin such as an epoxy resin, an acrylic resin, or a maleimide resin.

The epoxy resin is a compound having one glycidyl group or more in a molecule and is a resin that forms a three-dimensional net structure to cure when the glycidyl group reacts by heating. Two glycidyl groups or more are preferably contained in one molecule, since a compound having only one glycidyl group cannot exhibit a sufficient curing property even if the glycidyl group reacts. The compound containing two glycidyl groups or more in one molecule can be obtained through epoxidation of a compound having two hydroxyl groups or more. Examples of such a compound include: a bifunctional one obtained through the epoxidation of a bisphenol compound such as bisphenol A, bisphenol F, or bephenol, or a derivative of any of these, diol having an alicyclic structure such as hydrogen-added bisphenol A, hydrogen-added bisphenol F, hydrogen-added biphenol, cyclohexanediol, cyclohexanedimethanol, or cyclohexanediethanol, or a derivative of any of these, or aliphatic diol such as butanediol, hexanediol, octanediol, nonanediol, or decanediol, or a derivative of any of these; a trifunctional one obtained through the epoxidation of a compound having a trihydroxyphenylmethane skeleton or an aminophenol skeleton; and a polyfunctional one obtained through the epoxidation of a phenol novolac resin, a cresol novolac resin, a phenol aralkyl resin, a biphenyl aralkyl resin, or a naphtol aralkyl resin, but the epoxy resin is not limited to these. Further, the epoxy resin itself or as a mixture is preferably in a liquid form at room temperature in order for the resin composition to be in a paste form or in a liquid form at room temperature. A reactive diluent may also be used as is ordinarily used. Examples of the reactive diluent include monofunctional aromatic glycidyl ethers such as phenyl glycidyl ether and cresyl glycidyl ether, and aliphatic glycidyl ethers.

In this case, a curing agent is used for the purpose of curing the epoxy resin, and examples of the curing agent for the epoxy resin include aliphatic amine, aromatic amine, dicyandiamide, a dihydrazide compound, acid anhydride, and a phenolic resin. Examples of the dihydrazide compound include carboxylic acid dihydrazide such as adipic acid dihydrazide, dodecanoic acid dihydrazide, isophthalic acid dihydrazide, and p-oxybenzoic dihydrazide. Examples of the acid anhydride include phthalic anhydride, tetrahydrophthalic anhydride, hexahydrophthalic anhydride, endomethylene tetrahydrophthalic anhydride, dodecenylsuccinic anhydride, a reaction product of maleic anhydride and polybutadiene, and a copolymer of maleic anhydride and styrene.

The phenol resin used as the curing agent for the epoxy rein is a compound having two phenolic hydroxyl groups or more in one molecule, and a compound having one phenolic hydroxyl group in one molecule is not usable since it cannot have a cross-linked structure and worsens the properties of the cured product.

The number of the phenolic hydroxyl groups in one molecule may be two or more, but the number of the phenolic hydroxyl groups is preferably two to five. It is not preferable that this number is larger than this, since the molecular weight becomes too large and thus the viscosity of the conductive paste becomes too high. The number of the phenolic hydroxyl groups in one molecule is more preferably two or three.

Examples of such a compound include bisphenols such as bisphenol F, bisphenol A, bisphenol S, tetramethylbisphenol A, tetramethylbisphenol F, tetramethylbisphenol S, dihydroxydiphenyl ether, dihydroxybenzophenone, tetramethylbisphenol, ethylidenebisphenol, methylethylidenebis(methylphenol), cyclohexylidenebisphenol, and biphenol, and derivatives thereof, trifunctional phenols such as tri(hydroxyphenyl)methane and tri(hydroxyphenyl)ethane, and derivatives thereof, and compounds mainly with two neuclides or three neuclides obtained through a reaction of phenols such as phenol novolac and cresol novolac with formaldehyde, and derivatives thereof.

Further, a curing accelerator can be compounded to accelerate the curing, and examples of the curing accelerator for the epoxy resin include imidazoles, triphenylphosphine or tetraphenylphosphine and salts of these, an amine compound such as diazabicycloundecene and salt thereof. For example, an imidazole compound is suitably used such as 2-methylimidazole, 2-ethylimidazole, 2-phenylimidazole, 2-phenyl-4-methylimidazole, 2-phenyl-4-methyl-5-hydroxymethylimidazole, 2-phenyl-4,5-dihydroxymethylimidazole, 2-$C_{11}H_{23}$-imidazole, and an adduct of 2-methylimidazole and 2,4-diamino-6-vinyltriazine. Among them, an imidazole compound whose melting point is 180° C. or higher is especially preferable. Further, the co-use of the epoxy resin with a cyanate resin, an acrylic resin, or a maleimide resin is also preferable.

The radical polymerizable acrylic resin is a compound having a (meth)acryloyl group in a molecule, and is a resin that forms a three-dimensional net structure to cure when the (meth)acryloyl group reacts. The number of the (meth) acryloyl groups contained in the molecule is preferably one or more.

Here, examples of the acrylic resin include: (meth)acrylate having a hydroxyl group, such as 2-hydroxyethyl(meth) acrylate, 2-hydroxypropyl(meth)acrylate, 3-hydroxypropyl (meth)acrylate, 2-hydroxybutyl(meth)acrylate, 3-hydroxybutyl(meth)acrylate, 4-hydroxybutyl(meth)acrylate, 1,2-cyclohexanediol mono(meth)acrylate, 1,3-cyclohexanediol mono(meth)acrylate, 1,4-cyclohexanediol mono (meth)acrylate, 1,2-cyclohexanedimethanol mono(meth) acrylate, 1,3-cyclohexanedimethanol mono(meth)acrylate, 1,4-cyclohexanedimethanol mono(meth)acrylate, 1,2-cyclohexanediethanol mono(meth)acrylate, 1,3-cyclohexanediethanol mono(meth)acrylate, 1-4-cyclohexanediethanol mono(meth)acrylate, glycerin mono(meth)acrylate, glycerin di(meth)acrylate, trimethylolpropane mono(meth)acrylate, trimethylolpropane di(meth)acrylate, pentaerythritol mono (meth)acrylate, pentaerythritol di(meth)acrylate, pentaerythritol tri(meth)acrylate, and neopentyl glycol mono(meth) acrylate; and (meth)acrylate having a carboxyl group, which is obtained through a reaction of any of these (meth) acrylates having the hydroxyl group with dicarboxylic acid or its derivative. Examples of the dicarboxylic acid usable here include oxalic acid, malonic acid, succinic acid, glutaric acid, adipic acid, pimelic acid, suberic acid, azelaic acid, sebacic acid, maleic acid, fumaric acid, phthalic acid, tetrahydrophthalic acid, and hexahydrophthalic acid, and derivatives of these.

Other usable examples include methyl(meth)acrylate, ethyl(meth)acrylate, n-butyl(meth)acrylate, isobutyl(meth) acrylate, t-butyl(meth)acrylate, isodecyl(meth)acrylate, lauryl(meth)acrylate, tridecyl(meth)acrylate, cetyl(meth) acrylate, stearyl(meth)acrylate, isoamyl (meth)acrylate, isostearyl(meth)acrylate, behenyl(meth)acrylate, 2-ethylhexyl(meth)acrylate, other alkyl(meth)acrylate, cyclohexyl (meth)acrylate, t-butylcyclohexyl(meth)acrylate, tetrahydrofurfuryl(meth)acrylate, benzil(meth)acrylate, phenoxyethyl(meth)acrylate, isobornyl(meth)acrylate, glycidyl(meth)acrylate, trimethylolpropane(meth)acrylate, zinc mono(meth)acrylate, zinc di(meth)acrylate, dimethylaminoethyl(meth)acrylate, diethylaminoethyl(meth)acrylate, neopentyl glycol(meth)acrylate, trifluoroethyl(meth)acrylate, 2,2,3,4-tetrafluoropropyl(meth)acrylate, 2,2,3,3,4,4-hexafluorobutyl(meth)acrylate, perfluorooctyl(meth)acrylate, perfluorooctylethyl(meth)acrylate, ethylene glycol di(meth)acrylate, propylene glycol di(meth)acrylate, 1,4-butanediol di(meth)acrylate, 1,6-hexanediol di(meth)acrylate, 1,9-nonanediol di(meth)acrylate, 1,3-butanediol di(meth)acrylate, 1,10-decanediol di(meth)acrylate, tetramethylene glycol di(meth)acrylate, methoxyethyl (meth)acrylate, butoxyethyl(meth)acrylate, ethoxydiethylene glycol(meth)acrylate, methoxypolyalkylene glycol mono(meth)acrylate, octoxy polyalkylene glycol mono (meth)acrylate, lauroxypolyalkylene glycol mono(meth) acrylate, stearoxy polyalkylene glycol mono(meth)acrylate, allyloxy polyalkylene glycol mono(meth)acrylate, nonylphenoxy polyalkylene glycol mono(meth)acrylate, acryloylmorpholine, hydroxyethylacrylamide, N,N'-methylene bis(meth)acrylamide, N,N'-ethylene bis(meth)acrylamide, 1,2-di(meth)acrylamide ethylene glycol, di(meth)acryloyloxymethyl tricyclodecane, N-(meth)acryloyloxyethyl maleimide, N-(meth)acryloyloxyethylhexa hydrophthalimide, N-(meth)acryloyloxyethyl phthalimide, n-vinyl-2-pyrrolidone, a styrene derivative, and an α-methylstyrene derivative.

An especially preferable acrylic resin is polyether, polyester, polycarbonate, or poly(meth)acrylate that has a 100 to 10000 molecular weight and is a compound having a (meth) acrylic group, (meth)acrylate having a hydroxyl group, or (meth)acrylamide having a hydroxyl group.

Here, the polyether skeleton is preferably one in which an organic group having a carbon number of 1 to 6 is repeated via an ether bond, and is preferably one not containing an aromatic ring. The compound that is the polyether and has the (meth)acrylic group can be obtained through a reaction of polyether polyol with (meth)acrylic acid or its derivative.

The polyester skeleton is preferably one in which an organic group having a carbon number of 1 to 6 is repeated via an ester bond and is preferably one not containing an aromatic ring. The compound that is the polyester and has the (meth)acrylic group can be obtained through a reaction of polyester polyol with (meth)acrylic acid or its derivative.

The polycarbonate skeleton is preferably one in which an organic group having a carbon number of 1 to 6 is repeated via a carbonate bond and is preferably one not containing an aromatic ring. The compound that is the polycarbonate and has the (meth)acrylic group can be obtained through a reaction of polycarbonate polyol with (meth)acrylic acid or its derivative.

The poly(meth)acrylate skeleton is preferably a copolymer of (meth)acrylic acid and (meth)acrylate, a copolymer of (meth)acrylate having a hydroxyl group and (meth) acrylate not having a polar group such as a carboxyl group or a hydroxyl group, a copolymer of (meth)acrylate having a glycidyl group and (meth)acrylate not having a polar group, or the like. The above copolymers can be obtained through a reaction of a carboxyl group with (meth)acrylate having a hydroxyl group or (meth)acrylate having a glycidyl group, obtained through a reaction of a hydroxyl group with (meth)acrylic acid not having a polar group or its derivative, and obtained through a reaction of a glycidyl group with (meth)acrylic acid not having a polar group or its derivative, respectively.

The compound that is the poly(meth)acrylate and has the (meth)acrylic group can be obtained through a reaction of poly(meth)acrylate polyol with (meth)acrylic acid or its derivative.

The (meth)acrylate or the (meth)acrylamide having the hydroxyl group is (meth)acrylate or (meth)acrylamide having one (meth)acrylic group or more in one molecule and also contains the hydroxyl group.

The (meth)acrylate having the hydroxyl group can be obtained through a reaction of a polyol compound with (meth)acrylic acid or its derivative. As this reaction, a well-known reaction is usable, and acrylic ester or acrylic acid whose molar quantity is about 0.5 to 5 times that of the polyol compound is ordinarily used.

Further, the (meth)acrylamide having the hydroxyl group can be obtained through a reaction of an amine compound having a hydroxyl group with (meth)acrylic acid or its derivative. In the method of manufacturing (meth)acrylamides through the reaction of the (meth)acrylic ester and the amine compound, since a double bond of the (meth)acrylic ester is very rich in reactivity, an intended product is usually manufactured by adding amine, cyclopentadiene, alcohol, or the like in advance as a protecting group to the double bond and eliminating the protecting group by heating after the amidation is finished.

With the hydroxyl group being thus contained, sinterability due to a reducing effect is promoted and adhesiveness improves.

The hydroxyl group mentioned here is an alcoholic group in which a hydrogen atom of an aliphatic hydrocarbon group is substituted, and the content of this hydroxyl group is preferably 1 to 50 pieces in one molecule, and when the content of the hydroxyl group is within this range, sinterability is not hindered by excessive curing, which is preferable.

Examples of an acrylic resin compound having such a hydroxyl group include compounds expressed by the following general formulas (I) to (IV).

(I)

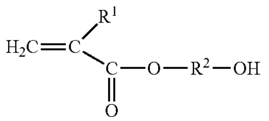

In the formula, $R^1$ represents a hydrogen atom or a methyl group, $R^2$ represents a bivalent aliphatic hydrocarbon group with a carbon number of 1 to 100 or an aliphatic hydrocarbon group having a ring structure.

(II)

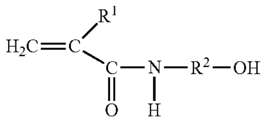

In the formula, $R^1$ and $R^2$ represent the same as above.

(III)

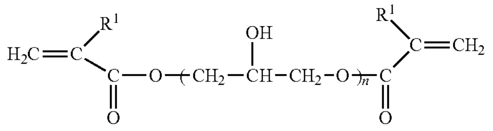

(In the formula, $R^1$ represents the same as above, and n represents an integer 1 to 50.)

(IV)

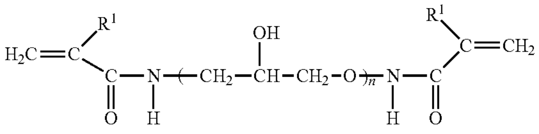

In the formula, $R^1$ and n represent the same as above.

As this (meth)acrylate or (meth)acrylamide, any of the aforesaid compounds is usable alone or a combination of two kinds of more of them is usable. Note that the carbon number of $R^2$ in the formulas (I) and (II) is preferably 1 to 100, and more preferably 1 to 36. When the carbon number of $R^2$ is within this range, sinterability is not hindered by the excessive curing, which is preferable.

Here, in a case where the component (D) is the acrylic resin, a polymerization initiator is ordinarily used in its polymerization. The polymerization initiator is preferably a thermal radical polymerization initiator, and is not limited to a particular one, and any known thermal radical polymerization initiator is usable. Further, the thermal radical polymerization initiator preferably has a decomposition temperature of 40 to 140° C. in a rapid heating test (a kick-off temperature when a 1 g sample is placed on a hot plate and heated at 4° C./minute). If the decomposition temperature is lower than 40° C., storage stability of the conductive paste at room temperature worsens, and if it is over 140° C., the curing time becomes extremely long. Specific examples of the thermal radical polymerization initiator satisfying such a property include methyl ethyl ketone peroxide, methylcyclohexanone peroxide, methylacetoacetate peroxide, acetylacetone peroxide, 1,1-bis(t-butylperoxy)3,3,5-trimethylcyclohexane, 1,1-bis(t-hexylperoxy)cyclohexane, 1,1-bis(t-hexylperoxy)3,3,5-trimethylcyclohexane, 1, 1,-bis(t-butylperoxy)cyclohexane, 2,2-bis(4,4-di-t-butylperoxycyclohexyl)propane, 1,1-bis(t-butylperoxy) cyclododecane, n-butyl-4,4-bis(t-butylperoxy)valerate, 2,2-bis(t-butylperoxy)butane, 1,1-bis(t-butylperoxy)-2-methylcyclohexanone, t-butyl hydroperoxide, p-menthane hydroperoxide, 1,1,3,3-tetramethylbutyl hydroperoxide, t-hexyl hydroperoxide, dicumyl peroxide, 2,5-dimethyl-2,5-bis(t-butylperoxy)hexane, α,α'-bis(t-butylperoxy)diisopropylbenzene, t-butyl cumyl peroxide, di-t-butyl peroxide, 2,5-dimethyl-2,5-bis(t-butylperoxy)hexyne-3, isobutyryl peroxide, 3,5,5-trimethylhexanoyl peroxide, octanoyl peroxide, lauroyl peroxide, cinnamic acid peroxide, m-toluoyl peroxide, benzoyl peroxide, diisopropyl peroxydicarbonate, bis(4-t-butylcyclohexyl)peroxydicarbonate, di-3-methoxybutyl peroxydicarbonate, di-2-ethylhexyl peroxydicarbonate, di-sec-butyl peroxydicarbonate, di(3-methyl-3-methoxybutyl)peroxydicarbonate, di(4-t-butylcyclohexyl)

peroxydicarbonate, α,α'-bis(neodecanoylperoxy) diisopropylbenzene, cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxyneodecanoate, t-hexyl peroxypivalate, t-butyl peroxypivalate, 2,5-dimethyl-2,5-bis(2-ethylhexanoylperoxy)hexane, 1,1,3,3-tetramethylbutylperoxy-2-ethylhexanoate, 1-cyclohexyl-1-methylethyl peroxy-2-ethylhexanoate, t-hexylperoxy-2-ethylhexanoate, t-butylperoxy-2-ethylhexanoate, t-butylperoxy isobutyrate, t-butylperoxymaleic acid, t-butylperoxy laurate, t-butylperoxy-3,5,5-trimethylhexanoate, t-butylperoxyisopropyl monocarbonate, t-butylperoxy-2-ethylhexyl monocarbonate, 2,5-dimethyl-2,5-bis(benzoylperoxy)hexane, t-butylperoxy acetate, t-hexyl peroxybenzoate, t-butylperoxy-m-toluoylbenzoate, t-butyl peroxybenzoate, bis(t-butylperoxy) isophthalate, t-butylperoxyallyl monocarbonate, and 3,3',4,4'-tetra(t-butylperoxycarbonyObenzophenone. They each may be used alone or a mixture of two kinds of them or more may be used. In the case where the mixture of two kinds or more is used, curability can be controlled by a combination of them, a mixture ratio or the like. Further, the aforesaid radical polymerizable acrylic resin is also preferably used together with a cyanate resin, an epoxy resin, or a maleimide resin.

The polymerization initiator may be used alone, or in order to control curability, a mixture of two kinds or more of them may be used. Further, in order to improve storage stability of a die attach paste, various kinds of polymerization inhibitors can also be added in advance.

A compounding ratio of this thermal radical initiator is preferably 0.1 to 10 parts by mass to 100 parts by mass of the radical polymerizable acrylic resin components. If the compounding ratio is over 10 parts by mass, the die attach paste greatly changes in viscosity with time, which may cause a problem in workability. If the compounding ratio is less than 0.1 parts by mass, curability may greatly lower.

The maleimide resin is a compound containing one maleimide group or more in one molecule and is a resin that forms a three-dimensional net structure to cure when the maleimide group reacts by heating. Examples thereof include bismaleimide resins such as N,N'-(4,4'-diphenylmethane)bismaleimide, bis(3-ethyl-5-methyl-4-maleimidephenyl)methane, and 2,2-bis[4-(4-maleimidephenoxy)phenyl]propane. The maleimide resin is more preferably a compound obtained through a reaction of dimer acid diamine with maleic anhydride, or a compound obtained through a reaction of maleimidized amino acid such as maleimide acetic acid or maleimide caproic acid with polyol. The maleimidized amino acid is obtained through a reaction of maleic anhydride with aminoacetic acid or aminocaproic acid. The polyol is preferably polyether polyol, polyester polyol, polycarbonate polyol, or poly(meth)acrylate polyol, and is especially preferably one not containing an aromatic ring.

The maleimide group is reactable with an allyl group and thus is also preferably used with an allyl ester resin. The allyl ester resin is preferably aliphatic, and is especially preferably a compound obtained through ester exchange between cyclohexane diallyl ester and aliphatic polyol. A number average molecular weight of the allyl ester resin compound is not limited to a particular value, but is preferably 500 to 10,000, and especially preferably 500 to 8,000. When the number average molecular weight is within the above range, it is possible to reduce especially curing shrinkage to prevent a decrease of adhesion. Further, the co-use with a cyanate resin, an epoxy resin, or an acrylic resin is also preferable.

Further, the maleimide resin is especially preferably a bismaleimide resin that has an aliphatic hydrocarbon group at its main chain and in which the main chain coupling two maleimide groups has the aliphatic hydrocarbon group having a carbon number of 1 or more.

Here, the aliphatic hydrocarbon group may be straight-chained, branch-chained, or cyclic, and its carbon number is preferably 6 or more, more preferably 12 or more, and especially preferably 24 or more. Further, this aliphatic hydrocarbon group is preferably directly bonded with the maleimide groups.

Further, as the maleimide resin, a compound expressed by the following general formula (V) is also preferably used, for instance.

(V)

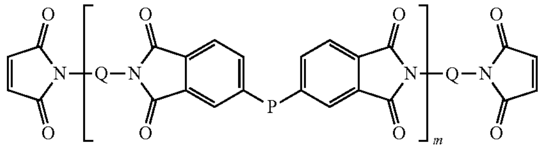

In the formula, Q represents a bivalent straight-chained, branch-chained, or cyclic aliphatic hydrocarbon group with a carbon number of 6 or more, P represents a bivalent atom or organic group and a group containing at least one bivalent atom or organic group or more selected from O, CO, COO, $CH_2$, $C(CH_3)_2$, $C(CF_3)_2$, S, $S_2$, SO, and $SO_2$, and m represents an integer 1 to 10.

Here, the bivalent atom represented by P is O, S, or the like, and the bivalent organic group represented by P is CO, COO, $CH_2$, $C(CH_3)_2$, $C(CF_3)_2$, $S_2$, SO, $SO_2$, or the like, or P is an organic group containing at least one of these atoms or organic groups. Examples of the organic group containing the aforesaid atom or organic group and having other structure than the above include those having a hydrocarbon group with a carbon number of 1 to 3, a benzene ring, a cyclo ring, or a urethane bond, and examples of P in this case include groups expressed by the following chemical formulas.

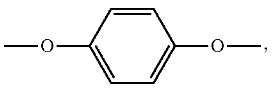

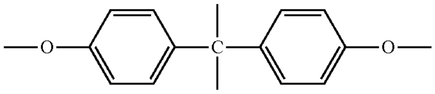

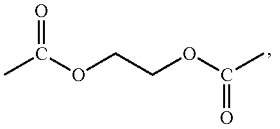

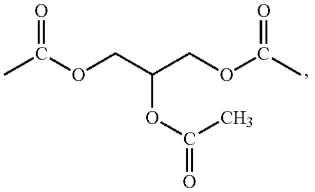

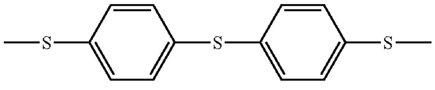

The use of the bismaleimide resin having the aliphatic hydrocarbon group at its main chain is preferable since it enables to obtain a thermosetting resin composition for semiconductor bonding excellent in heat resistance, low in stress, and good in thermal-time adhesion strength after moisture absorption.

Specific examples of such a maleimide resin include BMI-1500 (brand name, manufactured by Designer Molecules Inc.; molecular weight 1500) and BMI-1700 (brand name, manufactured by Designer Molecules Inc.; molecular weight 1700).

Further, the maleimide resin is especially preferably co-used with an allylated epoxy resin which is a polymer of allylated bisphenol and epichlorohydrin, or with the aforesaid radical polymerizable acrylic resin containing the hydroxyl group.

Here, the allylated epoxy resin which is the polymer of the allylated bisphenol and the epichlorohydrin can be obtained as follows, for instance. A polyhydric phenol compound is dissolved in a solvent of alcohols such as methanol, isopropanol, or n-propanol or ketones such as acetone or methyl ethyl ketone, thereafter is made to react with halogenated allyl such as allyl chloride or allyl bromide, using a base such as sodium hydroxide or potassium hydroxide, whereby allyl ether of the polyhydric phenol compound is obtained, and thereafter while a solid of alkali metal hydroxide such as sodium hydroxide or potassium hydroxide is added at a time or gradually as a catalyst to a mixture of the allylated polyhydric phenol compound and epihalohydrin, they are made to react at 20 to 120° C. for 0.5 to 10 hours.

As the allylated epoxy resin, a compound expressed by the following general formula (VI) is preferably used.

nent, deterioration caused by light and heat occurs, resulting in a decrease of coloring and strength, and thus the life of the light emitting device becomes short. With the compounding ratio within such a range, it is possible to easily prevent the mutual contact of the silver particles and maintain mechanical strength of the whole adhesive layer, by utilizing adhesive performance of the acrylic resin.

The present invention basically contains the above-described components (A) to (D) as essential components, but may contain components (E) to (F) described below as required.

In the present invention, an organic matter may be further added as a flux component (E). Here, the flux component refers to that having flux activity for removing an oxide coating film of a substrate. Examples of the flux component (E) include carboxylic acids.

The carboxylic acid may be either aliphatic carboxylic acid or aromatic carboxylic acid. Examples of the aliphatic carboxylic acid include malonic acid, methylmalonic acid, dimethylmalonic acid, ethylmalonic acid, allylmalonic acid, 2,2'-thiodiacetic acid, 3,3'-thiodipropionic acid, 2,2'-(ethylenedithio)diacetic acid, 3,3'-dithiopropionic acid, 2-ethyl-2-hydroxybutyric acid, dithiodiglycolic acid, diglycolic acid, acetylenedicarboxylic acid, maleic acid, malic acid, 2-isopropylmalic acid, tartaric acid, itaconic acid, 1,3-acetonedicarboxylic acid, tricarboxylic acid, muconic acid, β-hydromuconic acid, succinic acid, methylsuccinic acid, dimethylsuccinic acid, glutaric acid, α-ketoglutaric acid, 2-methylglutaric acid, 3-methylglutaric acid, 2,2-dimethylglutaric acid, 3,3-dimethylglutaric acid, 2,2-bis(hydroxymethyl)propionic acid, citric acid, adipic acid, 3-tert-butyladipic acid, pimelic acid, phenyloxalic acid, phenylacetic acid, (VI)

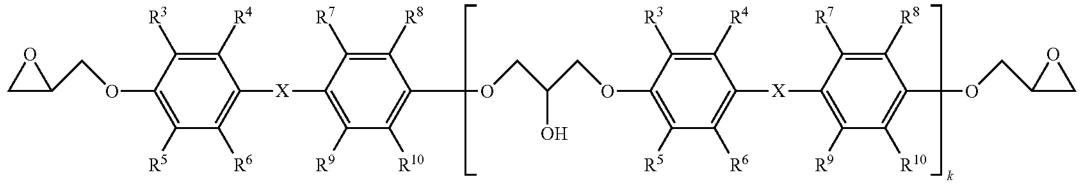

In the formula, $R^3$ to $R^{10}$ are each a group selected from a hydrogen atom, a substituted or unsubstituted alkyl group, and a substituted or unsubstituted ally group, at least one of them being the substituted or unsubstituted allyl group, X is a bivalent atom or organic group selected from SO, $SO_2$, $CH_2$, $C(CH_3)_2$, $C(CF_3)_2$, O, CO, and COO, and k is 0 or 1.

In the case where the maleimide resin and the allylated epoxy resin are co-used, their compounding ratio is preferably 50/50 to 95/5, and more preferably 65/35 to 90/10.

In the case where the maleimide resin and the radical polymerizable acrylic resin are co-used, their compounding ratio is preferably 5/95 to 95/5.

Here, an amount of the component (D) is 1 to 20 parts by mass to 100 parts by mass being the total amount of the silver fine particles as the component (A) and the silver powder as the component (B). If the component (D) is less than 1 part by mass, an amount of the silver component becomes too large to make the viscosity too high, leading to a handling difficulty, which is not preferable as an adhesive. If the component (D) is over 20 parts by mass, a ratio of the silver component lowers, which cannot sufficiently ensure high thermal conductivity to lower a heat dissipation property. Further, due to a large amount of the organic componitrophenylacetic acid, phenoxyacetic acid, nitrophenoxyacetic acid, phenylthioacetic acid, hydroxyphenylacetic acid, dihydroxyphenylacetic acid, mandelic acid, hydroxymandelic acid, dihydroxymandelic acid, 1,2,3,4-butanetetracarboxylic acid, suberic acid, 4,4'-dithiodibutyric acid, cinnamic acid, nitrocinnamic acid, hydroxycinnamic acid, dihydroxycinnamic acid, coumaric acid, phenylpyruvic acid, hydroxyphenylpyruvic acid, caffeic acid, homophthalic acid, tolylacetic acid, phenoxypropionic acid, hydroxyphenylpropionic acid, benzyloxyacetic acid, phenyllactic acid, tropic acid, 3-(phenylsulfonyl)propionic acid, 3,3-tetramethyleneglutaric acid, 5-oxoazelaic acid, azelaic acid, phenylsuccinic acid, 1,2-phenylenediacetic acid, 1,3-phenylenediacetic acid, 1,4-phenylenediacetic acid, benzylmalonic acid, sebacic acid, dodecanoic diacid, undecanoic diacid, diphenylacetic acid, benzilic acid, dicyclohexylacetic acid, tetradecane diacid, 2,2-diphenylpropionic acid, 3,3-diphenylpropionic acid, 4,4-bis(4-hydroxyphenyl)valeric acid, pimaric acid, palustric acid, isopimaric acid, abietic acid, dehydroabietic acid, neoabietic acid, and agathic acid. Examples of the aromatic carboxylic acid include benzoic acid, 2-hydroxybenzoic acid, 3-hydroxybenzoic acid, 4-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, 2,3,4-trihydroxybenzoic acid, 2,4,6-trihydroxybenzoic acid, 3,4,5-trihydroxybenzoic acid, 1,2,3-benzenetricarboxylic acid, 1,2,4-benzenetricarboxylic acid, 1,3,5-benzenetricarboxylic acid, 2-[bis(4-hydroxypheny)methyl]benzoic acid, 1-naphthoic acid, 2-naphthoic acid, 1-hydroxy-2-naphthoic acid, 2-hydroxy-1-naphthoic acid, 3-hydroxy-2-naphthoic acid, 6-hydroxy-2-naphthoic acid, 1,4-dihydroxy-2-naphthoic acid, 3,5-dihydroxy-2-naphthoic acid, 3,7-dihydroxy-2-naphthoic acid, 2,3-naphthalenedicarboxylic acid, 2,6-naphthalenedicarboxylic acid, 2-phenoxybenzoic acid, biphenyl-4-carboxylic acid, biphenyl-2-carboxylic acid, and 2-benzoylbenzoic acid. Among all, in view of storage stability and easy availability, it is preferable to use succinic acid, malic acid, itaconic acid, 2,2-bis(hydroxymethyl)propionic acid, adipic acid, 3,3'-thiodipropionic acid, 3,3'-dithiopropionic acid, 1,2,3,4-butanetetracarboxylic acid, suberic acid, sebacic acid, phenylsuccinic acid, dodecanoic diacid, diphenylacetic acid, benzilic acid, 4,4-bis(4-hydroxyphenyl)valeric acid, abietic acid, 2,5-dihydroxybenzoic acid, 3,4,5-trihydroxybenzoic acid, 1,2,4-benzenetricarboxylic acid, 1,3,5-benzenetricarboxylic acid, 2-[bis(4-hydroxyphenyl)methyl]benzoic acid, or the like. These compounds each may be used alone, or a combination of two kinds or more of them may be used.

The flux component (E) is especially preferably dicarboxylic acid, and is preferably one whose decomposition temperature is 100 to 300°, more preferably 150 to 290° C. The dicarboxylic acid not only removes the oxide coating film of the joined substrate but also removes an oxide coating film and silver oxide contained in a surface treatment agent of the component (A) and the component (B) by an exchange reaction at the time of joining heating, and simultaneously with the removal, the dicarboxylic acid itself decomposes or evaporates, and thus it does not obstruct the later sintering of the silvers. Consequently, a sintering promoting effect of causing the silvers to sinter at a lower temperature than in a case where it is not added is obtained. If the boiling point of the flux component (E) is lower than 100° C., its volatility is high even at room temperature and accordingly reducing power is likely to decrease due to the volatilization of a dispersion medium, which may not enable to obtain stable adhesion strength. It is not preferable that the boiling point of the flux component (E) is over 300° C., since the sintering does not easily occur in a conductive film and thus the film lacks denseness, and the flux component remains in the film without volatilizing.

The content of the flux component (E) is preferably 0.01 to 5 parts by mass to 100 parts by mass being the total amount of the component (A) and the component (B). It is not preferable that this content is over 5 parts by mass and the content is less than 0.01 parts by mass, since, in the former case, a void may occur to give an adverse effect to reliability, and in the latter case, flux activity does not function.

In the present invention, a solvent (F) may be further used. Any known solvent functioning as a reducing agent may be used as (F) the solvent. This solvent is preferably alcohol and an example thereof is aliphatic polyhydric alcohol. Examples of the aliphatic polyhydric alcohol include glycols such as ethylene glycol, diethylene glycol, propylene glycol, dipropylene glycol, 1,4-butanediol, glycerin, and polyethylene glycol. These solvents are each usable alone or a combination of two kinds or more of them is usable.

As for (F) the solvent, the temperature of the alcohol solvent functioning as the reducing agent becomes high due to heat treatment at the time of the curing (sintering) of the paste, so that the alcohol has an increased reducing power, and consequently silver oxide present in part of the silver powder and the silver particles, and metal oxide (for example, copper oxide) on the metal substrate are reduced by the alcohol to be pure metals, which is thought to be a reason why the cured film that is dense, has high electrical conductivity, and has high adhesion with the substrate can be formed. Further, the alcohol partly comes into a reflux state during the heat treatment at the time of the curing of the paste, since it is sandwiched between the semiconductor element and the metal substrate, so that the alcohol as the solvent is not lost from the system immediately due to the volatilization, and the metal oxide is more efficiently reduced at a paste curing temperature equal to or higher than the boiling point.

The boiling point of the solvent (F) is specifically 100 to 300° C., and more preferably 150 to 290° C. It is not preferable that the boiling point is lower than 100° C., since volatility becomes high even at room temperature and thus the reducing power is likely to deteriorate due to the volatilization of the dispersion medium, and stable adhesion strength cannot be obtained. It is not preferable, either, that the boiling point is higher than 300° C., since the sintering does not easily occur in the conductive film and thus the film lacks denseness, and the solvent remains in the film without volatilizing.

An amount of the solvent (F) is preferably 7 to 20 parts by mass to 100 parts by mass being the total amount of the component (A) and the component(B). If this amount is less than 7 parts by mass, the viscosity increases and workability may lower, and if it is over 20 parts by mass, the viscosity lowers and the silver in the paste may sink and reliability may lower.

In the thermosetting resin composition of the present invention, besides the above components, a curing accelerator, a stress reducing agent such as rubber or silicone, a coupling agent, a defoaming agent, a surface active agent, a coloring agent (pigment, dye), various kinds of polymerization inhibitors, oxidation inhibitors, and solvents, and other various kinds of additives which are ordinarily compounded in this kind of composition can be compounded as required within a range not obstructing the effects of the present invention. One kind out of these additives may be used alone or a mixture of two kinds or more of them may be used.

Examples of such additives include silane coupling agents such as epoxysilane, mercaptosilane, aminosilane, alkylsilane, Glade silane, vinylsilane, and sulfide silane, coupling agents such as a titanate coupling agent, an aluminum coupling agent, and an aluminum/zirconium coupling agent, coloring agents such as carbon black, solid stress reducing components such as silicone oil and silicone rubber, and organic ion exchangers such as hydrotalcite.

The thermosetting resin composition of the present invention can be prepared as follows. The above-described components (A) to (D), components (E) to (F) compounded as required, other additives such as the coupling agent, a solvent, and so on are fully mixed and thereafter are further kneaded using a disperse, a kneader, a three-roller mill, and so on, followed by defoaming.

The thermosetting resin composition of the present invention obtained in this manner has high thermal conductivity and an excellent heat dissipation property. Therefore, when used as a material for joining an element or a heat dissipation member onto a substrate or the like, it improves a property of dissipating heat inside the device to the outside and thus can stabilize a product property.

Next, the semiconductor device and the electrical/electronic component of the present invention will be described.

In the semiconductor device of the present invention, a semiconductor element is bonded on a substrate serving as an element support member, using the above-described thermosetting resin composition. That is, the thermosetting resin composition is used here as a die attach paste.

Here, the semiconductor element may be a known semiconductor element and examples thereof include a transistor and a diode. Another example of the semiconductor element is a light emitting element such as LED. The light emitting element is not limited to a particular kind, and an example thereof is that in which a nitride semiconductor such as InN, AlN, GaN, InGaN, AlGaN, or InGaAlN is formed as a light emitting layer on a substrate by a MOCVD method or the like. Examples of the element support member include copper, silver-plated copper, PPF (preplated lead frame), glass epoxy, and ceramics.

The use of the thermosetting resin composition of the present invention enables the joining of a substrate not metal-plated, as well. The semiconductor device obtained in this manner has remarkably higher connection reliability against heat cycle after the mounting than conventionally. Further, it has advantages of having a sufficiently small electric resistance value and being less subject to change with time, and thus having a long life with less time-dependent reduction of output even in the long-time driving.

Further, in the electrical/electronic component of the present invention, a heat dissipation member is bonded to a heat generation member, using the above-described thermosetting resin composition. That is, the thermosetting resin composition is used here as a material for heat dissipation member bonding.

Here, the heat generation member may be the above-described semiconductor element, a member having the semiconductor element, or other heat generation member. Examples of the heat generation member other than the semiconductor element include an optical pickup and a power transistor. Examples of the heat dissipation member include a heat sink and a heat spreader.

By thus bonding the heat dissipation member to the heat generation member using the above-described thermosetting resin composition, it is possible to efficiently dissipate heat generated in the heat generation member through the heat dissipation member to the outside to reduce a temperature increase of the heat generation member. Incidentally, the heat generation member and the heat dissipation member may be bonded directly via the thermosetting resin composition, or may be indirectly bonded with another member having high thermal conductivity therebetween.

EXAMPLES

Next, the present invention will be described in more detail based on examples, but the present invention is not limited to these examples at all.

Examples 1 to 10, Comparative Examples 1 to 4

Components were mixed according to the compositions in Table 1 and Table 2 and were kneaded with a roll, whereby resin pastes were obtained. The obtained resin pastes were evaluated by the following method. The results are also shown in Table 1 and Table 2. As materials used in the examples and the comparative examples, the following commercially available products were used.

(A1): plate-shaped silver fine particles (manufactured by Tokusen Kogyo Co., Ltd, brand name: M13; median particle size: 2 μm, thickness: 50 nm or less)

(A2): spherical silver fine particles (manufactured by Mitsuboshi Belting Ltd., brand name: MDot; average particle size: 50 nm)

(B): silver powder (manufactured by Fukuda Metal Powder and Foil Co., Ltd., brand name: AgC-212D; average particle size: 5 μm)

(C1): spherical resin particles 1 (manufactured by Shin-Etsu Chemical Co., Ltd., brand name: KMP-600; average particle size: 1 μm, compressive elastic modulus (30% K value): 5300 N/mm$^2$, compression recovery rate: 100%)

(C2): spherical resin particles 2 (manufactured by Soken Chemical & Engineering Co., Ltd., brand name: MX-1500; average particle size: 15 μt, compressive elastic modulus (30% K value): 1500 N/mm$^2$, compression recovery rate: 25%, CV value 2%)

(C3): spherical resin particles 3 (manufactured by Sekisui Chemical Co., Ltd, brand name: Micropearl AUEZ-035A; average particle size: 35 μm, Au layer: 20 nm, intermediate Ni layer: 30 nm, compressive elastic modulus (30% K value): 750 N/mm$^2$, compression recovery rate: 10%, CV value 5%)

(C4): spherical resin particles 4 (manufactured by Sekisui Chemical Co., Ltd, brand name: Micropearl AUE-035A; average particle size: 35 μm, Au layer: 20 nm, intermediate Ni layer: 30 nm, compressive elastic modulus (30% K value): 4600 N/mm$^2$, compression recovery rate: 55%, CV value 5%)

(D1): hydroxyethylacrylamide (manufactured by Kohjin Co., Ltd., HEAA)

(D2): imide-extended bismaleimide (manufactured by Designer Molecules Inc., brand name: BMI-1500; number average molecular weight 1500)

(D3): epoxy resin of diallylbisphenol A diglycidyl ether type (manufactured by Nippon Kayaku Co., Ltd., brand name: RE-810NM; epoxy equivalent weight 223, hydrolyzable chlorine 150 ppm (1N KOH-ethanol, dioxane solvent, reflux 30 minutes)

(D4): 4-hydroxybutyl acrylate (manufactured by Nihon Kasei Chemical Co., Ltd., brand name: 4HBA)

polymerization initiator: dicumyl peroxide (manufactured by NOF Corporation, brand name: PERCUMYL D; decomposition temperature in rapid heating test: 126° C.)

(E): malic acid (manufactured by Tokyo Chemical Industry Co., Ltd.)

(F): diethylene glycol (manufactured by Tokyo Chemical Industry Co., Ltd.)

<Evaluation Method>

[Viscosity]

A value at 25° C. and 5 rpm was measured using an E-type viscometer (3° cone).

[Pot Life]

The number of days taken for the viscosity to increase by 1.5 times the initial viscosity or more when each of the resin pastes was left in a 25° C. thermostatic bath was measured.

[Thermal-Time Adhesion Strength]

A 4 mm×4 mm chip with a gold rear surface, which had a gold deposition layer on a junction surface, was mounted on each of a pure copper frame and PPF (Ni—Pd/Au plated copper frame), using each of the resin pastes for semiconductors, and the resin pastes were cured at 200° C. for sixty minutes. After the curing and after a moisture absorption process (85° C., relative humidity 85%, 72 hours), thermal-time die shear strength was measured at 260° C. using a mounting strength measuring device.

[Thermal-Time Adhesion Strength after High-Temperature Heat Treatment]

A 4 mm×4 mm chip with a gold rear surface, which had a gold deposition layer on a junction surface, was mounted on a Mo substrate having a Ni—Pd/Au plated surface, using each of the resin pastes for semiconductors and the resin pastes were cured at 200° C. for sixty minutes. After heat treatment (250° C. heat treatment for 100 hours and for 1000 hours) as high-temperature heat treatment, and after thermal cycles (100 cycles and 1000 cycles, one cycle being an operation of increasing temperature from −40° C. to 250° C. and cooling again to −40° C.), thermal-time die shear strength at 260° C. was measured, using a mounting strength measuring device.

[Thermal Conductivity]

According to HS R1611-1997, thermal conductivity of each cured product was measured by a laser flash method.

[Electrical Resistance]

The conductive pastes were each applied on a glass substrate (1 mm thickness) to a thickness of 200 μm by a screen printing method, and were cured at 200° C. for sixty minutes. The electrical resistance of each obtained wiring line was measured by a four-terminal method, using "MCP-T600" (brand name, manufactured by Mitsubishi Chemical Corporation).

[Thermal Shock Resistance]

A 6 mm×6 mm chip with a gold rear surface, which had a gold deposition layer on a junction surface, was mounted on each of a copper frame and PPF, using each of the obtained resin pastes, and the resin pastes were thermally cured on a hotplate at 200° C. for sixty seconds (HP curing), or were thermally cured at 200° C. for sixty seconds, using an oven (OV curing). The resultants were each formed into a package under the following condition, using an epoxy sealing material manufactured by KYOCERA Chemical Corporation (brand name: KE-G3000D), and the packages were subjected to a moisture absorption process at 85° C. and a 85% relative humidity for 168 hours, and thereafter were subjected to IR reflowing (260° C., ten seconds) and a thermal cycle process (1000 cycles, one cycle being an operation of increasing the temperature from −55° C. to 150° C. and cooling to −55° C. again), and the number of cracks in each of the packages after each of the processes was found by the observation with an ultrasonic microscope. Among five samples, the number of samples where the crack occurred is shown.

package: 80 pQFP (14 mm×20 mm×2 mm thickness)

chip: silicon chip and chip having a gold-plated rear surface lead frame: PPF and copper molding of sealing material: 175° C., two minutes post-mold cure: 175° C., eight hours

[Energization Test]

By a stamping method, the conductive pastes were each applied on an aluminum substrate for light emitting devices whose side surface had a concave reflector structure, and a light emitting element of 600 μm square having a silver deposition layer was mounted thereon, followed by 200° C. and sixty-minute thermal curing. Next, an electrode of the light emitting element and an electrode of the substrate were connected by a gold wire and the resultant was sealed with a silicone resin (manufactured by Shin-Etsu Chemical Co., Ltd.). In this state, an energization test (test conditions 25° C., 50 mA) was conducted, and 500 hours later, 1000 hours later, and 2000 hours later, decreases of reflectivity from its initial value were calculated by the following expression.

$$\text{decrease ratio (\%) of reflectivity to initial value} = (\text{reflectivity after } t \text{ hours pass}) \div (\text{initial reflectivity}) \times 100$$

[Void Ratio]

The samples were observed with a microfocus X-ray inspection system (SMX-1000, manufactured by Shimadzu Corporation), and a void ratio of less than 5% was evaluated as "o", 5% or more and less than 8% as "A", and 8% or more as "x". Each solder junction was observed from a direction perpendicular to a junction surface with an X-ray transmission device, a void area and a junction area were found, and the void ratio was calculated by the following expression.

$$\text{void ratio (\%)} = \text{void area} \div (\text{void area} + \text{junction area}) \times 100$$

[Strain of Chip Surface]

An 8 mm×8 mm chip with a gold rear surface, which had a gold deposition layer on a junction surface, was mounted on a Mo substrate having a Ni—Pd/Au plated surface, using each of the resin pastes for semiconductors, the resin pastes were cured at 200° C. for sixty minutes, and a package warp of each of the resultant semiconductor packages was measured at room temperature. The measurement was conducted in conformity with JEITA ED-7306 of Japan Electronics and Information Technology Industries Association Standard, using a shadow moire measuring device (Thermoire AXP: manufactured by Akrometrix) as a measurement device. Specifically, a virtual plane calculated by the least square method of all the data on a substrate surface in a measurement region was defined as a reference plane, the maximum value in a perpendicular direction from the reference plane was defined as A, and the minimum value was defined as B, a value of |A|+|B| (Coplanarity) was defined as a value of the package warp, and this was evaluated as follows.

o: less than 5 μm, A: 5 μm or more and less than 10 μm, x: 10 μm or more

TABLE 1

| | | | | Example | | | |
|---|---|---|---|---|---|---|---|
| | | | | 1 | 2 | 3 | 4 |
| Composition (Parts by Mass) | Component (A) | (A1) Plate-Shaped Silver Fine Particles | M13 (Median Particle Size: 2 μm, Thickness 50 nm or less) | 27 | 27 | 27 | 30 |
| | | (A2) Spherical Silver Fine Particles | Mdot (Ave. Particle Size: 50 nm) | 3 | 3 | 3 | |
| | Component (B) | Silver Powder | Agc-212d (Ave. Particle Size: 5 μm) | 70 | 70 | 70 | 70 |
| | Component (C) | (C1) Spherical Resin Particles | KMP-600 (Ave. Particle Size: 1 μm) | 0.5 | 1.0 | 0.25 | 0.25 |
| | | (C2) Spherical Resin | Mx-1500 | | | 0.25 | |

TABLE 1-continued

| | | | | | | | |
|---|---|---|---|---|---|---|---|
| | | Particles 2 | (Ave. Particle Size: 15 μm) | | | | |
| | | (C3) Spherical Resin Particles 3 | AUEZ-035A (Ave. Particle Size: 35 μm) | | | | |
| | | (C4) Spherical Resin Particles 4 | AUE-035A (Ave. Particle Size: 35 μm) | | | | |
| | Component (D) | (D1) Hydroxyethylacrylamide | HEAA | 10 | 10 | 10 | 5 |
| | | (D2) Imide-Extended Bismaleimide | BMI-1500 | | | | 5 |
| | | (D3) Allylated Bisphenol Epoxy | RE-810NM | | | | |
| | | (D4) Hydroxyacrylate | 4HBA | | | | |
| | Polymerization Initiator | Dicumyl Peroxide | Pearcumyl D | 1 | 1 | 1 | 1 |
| | Component (E) | Malic Acid | | 0.1 | 0.1 | 0.1 | 0.1 |
| | Component (F) | Diethylene Glycol | | 10 | 10 | 10 | 10 |
| Property | Viscosity (Pa · s) | | | 28 | 35 | 26 | 28 |
| | Pot Life [Days] | | | >7 | >7 | >7 | >7 |
| | Thermal Conductivity [W/m · K] | | | 198 | 135 | 191 | 150 |
| | Electrical Resistance [Ω] | | | 4.E−06 | 4.E−06 | 4.E−06 | 5.E−06 |
| | Thermal-Time Adhesion Strength [N/Chip] | PPF | Normal State | 30 | 30 | 28 | 24 |
| | | | After Moisture Absorption Process | 30 | 30 | 28 | 23 |
| | | Copper Frame | Normal State | 28 | 28 | 25 | 18 |
| | | | After Moisture Absorption Process | 28 | 28 | 25 | 17 |
| | Thermal-Time Adhesion Strength after High-Temperature Treatment [N/Chip] | PPF | After 100-Hour Heat Treatment | 35 | 35 | 30 | 26 |
| | | | After 1000-Hour Heat Treatment | 35 | 35 | 30 | 26 |
| | | | After 100 Thermal Cycles | 34 | 34 | 30 | 26 |
| | | | After 1000 Thermal Cycles | 34 | 34 | 30 | 26 |
| | Thermal Shock Resistance [Occurrence Number of Internal Cracks/Number of Samples] | PPF | After IR Reflowing | 0 | 0 | 0 | 0 |
| | | | After 1000 Thermal Cycles | 0 | 0 | 0 | 0 |
| | | Copper Frame | After IR Reflowing | 0 | 0 | 0 | 0 |
| | | | After 1000 Thermal Cycles | 0 | 0 | 0 | 0 |
| | Energization Test [%] | 500 Hour Later | | 98% | 98% | 98% | 98% |
| | | 1000 Hour Later | | 96% | 96% | 96% | 96% |
| | | 2000 Hour Later | | 94% | 94% | 94% | 94% |
| | Void Ratio | | | ○ | ○ | ○ | ○ |
| | Strain of Chip Surface | | | Δ | Δ | ○ | Δ |

| | | | | Example | | |
|---|---|---|---|---|---|---|
| | | | | 5 | 6 | 7 |
| Composition (Parts by Mass) | Component (A) | (A1) Plate-Shaped Silver Fine Particles | M13 (Median Particle Size: 2 μm, Thickness 50 nm or less) | 30 | 27 | 27 |
| | | (A2) Spherical Silver Fine Particles | Mdot (Ave. Particle Size: 50 nm) | | 3 | 3 |
| | Component (B) | Silver Powder | Agc-212d (Ave. Particle Size: 5 μm) | 70 | 70 | 70 |
| | Component (C) | (C1) Spherical Resin Particles | KMP-600 (Ave. Particle Size: 1 μm) | 0.25 | 0.25 | |
| | | (C2) Spherical Resin Particles 2 | Mx-1500 (Ave. Particle Size: 15 μm) | | | 0.25 |
| | | (C3) Spherical Resin Particles 3 | AUEZ-035A (Ave. Particle Size: 35 μm) | | 0.25 | 0.25 |
| | | (C4) Spherical Resin Particles 4 | AUE-035A (Ave. Particle Size: 35 μm) | | | |
| | Component (D) | (D1) Hydroxyethylacrylamide | HEAA | | 10 | 10 |
| | | (D2) Imide-Extended Bismaleimide | BMI-1500 | 5 | | |
| | | (D3) Allylated Bisphenol Epoxy | RE-810NM | 5 | | |
| | | (D4) Hydroxyacrylate | 4HBA | | | |
| | Polymerization Initiator | Dicumyl Peroxide | Pearcumyl D | 1 | 1 | 1 |
| | Component (E) | Malic Acid | | 0.1 | 0.1 | 0.1 |
| | Component (F) | Diethylene Glycol | | 10 | 10 | 10 |
| Property | Viscosity (Pa · s) | | | 29 | 26 | 26 |
| | Pot Life [Days] | | | >7 | >7 | >7 |
| | Thermal Conductivity [W/m · K] | | | 120 | 195 | 191 |
| | Electrical Resistance [Ω] | | | 5.E−06 | 4.E−06 | 4.E−06 |
| | Thermal-Time Adhesion Strength [N/Chip] | PPF | Normal State | 25 | 26 | 28 |
| | | | After Moisture Absorption Process | 23 | 26 | 28 |
| | | Copper Frame | Normal State | 20 | 22 | 25 |
| | | | After Moisture Absorption Process | 18 | 21 | 25 |

TABLE 1-continued

| | | | | | |
|---|---|---|---|---|---|
| Thermal-Time Adhesion Strength after High-Temperature Treatment [N/Chip] | PPF | After 100-Hour Heat Treatment | 27 | 30 | 30 |
| | | After 1000-Hour Heat Treatment | 27 | 30 | 30 |
| | | After 100 Thermal Cycles | 27 | 20 | 30 |
| | | After 1000 Thermal Cycles | 27 | 20 | 30 |
| Thermal Shock Resistance [Occurrence Number of Internal Cracks/Number of Samples] | PPF | After IR Reflowing | 0 | 0 | 0 |
| | | After 1000 Thermal Cycles | 0 | 0 | 0 |
| | Copper Frame | After IR Reflowing | 0 | 0 | 0 |
| | | After 1000 Thermal Cycles | 0 | 0 | 0 |
| Energization Test [%] | 500 Hour Later | | 98% | 98% | 98% |
| | 1000 Hour Later | | 96% | 96% | 96% |
| | 2000 Hour Later | | 94% | 94% | 94% |
| Void Ratio | | | ○ | ○ | ○ |
| Strain of Chip Surface | | | Δ | ○ | ○ |

TABLE 2

| | | | | Example | | | Comparative Example |
|---|---|---|---|---|---|---|---|
| | | | | 8 | 9 | 10 | 1 |
| Composition (Parts by Mass) | Component (A) | (A1) Plate-Shaped Silver Fine Particles | M13 (Median Particle Size: 2 μm, Thickness 50 nm or less) | 27 | 27 | 27 | 27 |
| | | (A2) Spherical Silver Fine Particles | Mdot (Ave. Particle Size: 50 nm) | 3 | 3 | 3 | 3 |
| | Component (B) | Silver Powder | Agc-212d (Ave. Particle Size: 5 μm) | 70 | 70 | 70 | 70 |
| | Component (C) | (C1) Spherical Resin Particles | KMP-600 (Ave. Particle Size: 1 μm) | | 0.25 | | |
| | | (C2) Spherical Resin Particles 2 | Mx-1500 (Ave. Particle Size: 15 μm) | | 0.25 | | |
| | | (C3) Spherical Resin Particles 3 | AUEZ-035A (Ave. Particle Size: 35 μm) | 1.0 | | | |
| | | (C4) Spherical Resin Particles 4 | AUE-035A (Ave. Particle Size: 35 μm) | | | 0.5 | |
| | Component (D) | (D1) Hydroxyethylacrylamide | HEAA | 10 | | 10 | 10 |
| | | (D2) Imide-Extended Bismaleimide | BMI-1500 | | | | |
| | | (D3) Allylated Bisphenol Epoxy | RE-810NM | | | | |
| | | (D4) Hydroxyacrylate | 4HBA | | 10 | | |
| | Polymerization Initiator | Dicumyl Peroxide | Pearcumyl D | 1 | 1 | 1 | 1 |
| | Component (E) | Malic Acid | | 0.1 | 0.1 | 0.1 | 0.1 |
| | Component (F) | Diethylene Glycol | | 10 | 10 | 10 | 10 |
| Property | Viscosity (Pa · s) | | | 26 | 28 | 28 | 25 |
| | Pot Life [Days] | | | >7 | >7 | >7 | >7 |
| | Thermal Conductivity [W/m · K] | | | 145 | 198 | 194 | 200 |
| | Electrical Resistance [Ω] | | | 4.E−06 | 4.E−06 | 4.E−06 | 4.E−06 |
| | Thermal-Time Adhesion Strength [N/Chip] | PPF | Normal State | 28 | 32 | 16 | 27 |
| | | | After Moisture Absorption Process | 28 | 32 | 9 | 27 |
| | | Copper Frame | Normal State | 25 | 30 | 8 | 22 |
| | | | After Moisture Absorption Process | 25 | 30 | 5 | 22 |
| | Thermal-Time Adhesion Strength after High-Temperature Treatment [N/Chip] | PPF | After 100-Hour Heat Treatment | 30 | 36 | 17 | 14 |
| | | | After 1000-Hour Heat Treatment | 30 | 36 | 8 | 0 |
| | | | After 100 Thermal Cycles | 30 | 35 | 8 | 8 |
| | | | After 1000 Thermal Cycles | 30 | 35 | 5 | 0 |
| | Thermal Shock Resistance [Occurrence Number of Internal Cracks/Number of Samples] | PPF | After IR Reflowing | 0 | 0 | 0 | 0 |
| | | | After 1000 Thermal Cycles | 0 | 0 | 0 | 0 |
| | | Copper Frame | After IR Reflowing | 0 | 0 | 0 | 0 |
| | | | After 1000 Thermal Cycles | 0 | 0 | 0 | 0 |
| | Energization Test [%] | 500 Hour Later | | 98% | 98% | 75% | 98% |
| | | 1000 Hour Later | | 96% | 96% | 42% | 96% |
| | | 2000 Hour Later | | 94% | 94% | 25% | 94% |
| | Void Ratio | | | ○ | ○ | Δ | ○ |
| | Strain of Chip Surface | | | ○ | ○ | Δ | Δ |

TABLE 2-continued

| | | | | Comparative Example 2 | Comparative Example 3 | Comparative Example 4 |
|---|---|---|---|---|---|---|
| Composition (Parts by Mass) | Component (A) | (A1) Plate-Shaped Silver Fine Particles | M13 (Median Particle Size: 2 μm, Thickness 50 nm or less) | | 90 | 50 |
| | | (A2) Spherical Silver Fine Particles | Mdot (Ave. Particle Size: 50 nm) | | 10 | 5 |
| | Component (B) | Silver Powder | Agc-212d (Ave. Particle Size: 5 μm) | 100 | | 45 |
| | Component (C) | (C1) Spherical Resin Particles | KMP-600 (Ave. Particle Size: 1 μm) | | | |
| | | (C2) Spherical Resin Particles 2 | Mx-1500 (Ave. Particle Size: 15 μm) | | | |
| | | (C3) Spherical Resin Particles 3 | AUEZ-035A (Ave. Particle Size: 35 μm) | | | |
| | | (C4) Spherical Resin Particles 4 | AUE-035A (Ave. Particle Size: 35 μm) | | | |
| | Component (D) | (D1) Hydroxyethylacrylamide | HEAA | 10 | 10 | 40 |
| | | (D2) Imide-Extended Bismaleimide | BMI-1500 | | | |
| | | (D3) Allylated Bisphenol Epoxy | RE-810NM | | | |
| | | (D4) Hydroxyacrylate | 4HBA | | | |
| | Polymerization Initiator | Dicumyl Peroxide | Pearcumyl D | 1 | 1 | 1 |
| | Component (E) | Malic Acid | | 0.1 | 0.1 | 0.1 |
| | Component (F) | Diethylene Glycol | | 10 | 10 | 10 |
| Property | Viscosity (Pa · s) | | | 16 | 28 | 20 |
| | Pot Life [Days] | | | >7 | >7 | >7 |
| | Thermal Conductivity [W/m · K] | | | 5 | 100 | 18 |
| | Electrical Resistance [Ω] | | | 1.E−04 | 6.E−06 | 8.E−05 |
| | Thermal-Time Adhesion Strength [N/Chip] | PPF | Normal State | 3.4 | 3.2 | 5 |
| | | | After Moisture Absorption Process | 0 | 2.9 | 4.5 |
| | | Copper Frame | Normal State | 3.4 | 3.3 | 5 |
| | | | After Moisture Absorption Process | 0 | 2.6 | 3 |
| | Thermal-Time Adhesion Strength after High-Temperature Treatment [N/Chip] | PPF | After 100-Hour Heat Treatment | 0 | 0 | 3 |
| | | | After 1000-Hour Heat Treatment | 0 | 0 | 0 |
| | | | After 100 Thermal Cycles | 0 | 0 | 2 |
| | | | After 1000 Thermal Cycles | 0 | 0 | 0 |
| | Thermal Shock Resistance [Occurrence Number of Internal Cracks/Number of Samples] | PPF | After IR Reflowing | 5 | 4 | 4 |
| | | | After 1000 Thermal Cycles | 5 | 5 | 5 |
| | | Copper Frame | After IR Reflowing | 5 | 4 | 4 |
| | | | After 1000 Thermal Cycles | 5 | 5 | 5 |
| | Energization Test [%] | 500 Hour Later | | 87% | 99% | 92% |
| | | 1000 Hour Later | | 78% | 98% | 85% |
| | | 2000 Hour Later | | 60% | 96% | 50% |
| | Void Ratio | | | ○ | x | ○ |
| | Strain of Chip Surface | | | ○ | x | ○ |

From the above results, it has been found out that the thermosetting resin composition of the present invention is excellent in thermal conductivity, excellent in low stress property, good in bonding property, and excellent in reflow peeling resistance. It has also been found out that making the resin particles contained can reduce the occurrence of voids, and further, using specific resin particles is effective for reducing the strain of the chip. Further, the thermosetting resin composition of the present invention is high especially in thermal-time adhesion strength after the high-temperature treatment. Therefore, the use of this thermosetting resin composition as a die attach paste for element bonding or a material for heat dissipation member bonding can achieve a semiconductor device and an electrical/electronic device having excellent reliability.

What is claimed is:

1. A thermosetting resin composition comprising:

(A) silver fine particles;

(B) a silver powder other than the silver fine particles (A), the silver powder having an average particle size of more than 0.2 pm and 30 μm or less;

(D) a liquid thermosetting resin;

(E) a flux; and (F) a solvent, wherein the silver fine particles (A) include plate-shaped silver fine particles (A1) having a uniform thickness, wherein the plate-shaped silver fine particles (A1) are obtained through growth of one metal crystal plane and their upper surfaces are covered with [111] planes, wherein a longer side in a perpendicular direction to a thickness direction of the plate-shaped silver fine particles (A1) is within a range of 8 to 150 times as large as the thickness, wherein an amount of the liquid thermosetting resin (D) is 1 to 20 parts by mass, to 100 parts by mass being a total amount of the silver fine particles (A) and the silver powder (B), and wherein an amount of the solvent (F) is from 7 to 20 parts by mass, to 100 parts by mass being the total amount of the silver find particles (A) and the silver powder (B).

2. The thermosetting resin composition according to claim 1, wherein the silver fine particles (A) include spherical silver fine particles (A2) having an average particle size of 10 to 200 nm.

3. The thermosetting resin composition according to claim 1, further comprising resin particles (C).

4. The thermosetting resin composition according to claim 1, wherein the plate-shaped silver fine particles (A1) is having a median particle size of 0.3 to 15 μm and a thickness of 10 to 200 nm.

5. The thermosetting resin composition according to claim 4, wherein the silver fine particles (A) include spherical silver fine particles (A2) having an average particle size of 10 to 200 nm.

6. The thermosetting resin composition according to claim 5, further comprising resin particles (C).

7. The thermosetting resin composition according to claim 6, wherein an average particle size of the resin particles (C) is 0.5 to 50 μm.

8. The thermosetting resin composition according to claim 6, wherein the resin particles (C) are cross-linked polymers, which are made of any one of or a mixture of divinylbenzene, a methyl methacrylate resin (PMMA), an ethyl methacrylate resin (PEMA), a butyl methacrylate resin (PBMA), and a methyl methacrylate-ethyl methacrylate copolymer.

9. The thermosetting resin composition according to claim 6, wherein the resin particles (C) are silicone powders, which are any one of silicone rubber particles, silicone resin particles, and silicone composite particles in which surfaces of silicone rubber particles are coated with silicone resin.

10. The thermosetting resin composition according to claim 6, wherein an amount of the resin particles (C) is 0.01 to 1 part by mass, to 100 parts by mass being the total amount of the silver fine particles (A) and the silver powder (B).

11. The thermosetting resin composition according to claim 1, wherein the plate-shaped silver fine particles (A1) self-sinter at 100° C. to 250° C.

12. The thermosetting resin composition according to claim 1, wherein a mass ratio of the silver fine particles (A) and the silver powder (B) is 10:90 to 90:10.

13. A semiconductor device comprising:

a substrate;

a semiconductor element bonded on the substrate; and a die attach paste bonding the substrate to the semiconductor element, the die attach paste having the thermosetting resin composition according to claim 1.

14. The semiconductor device according to claim 13, wherein the semiconductor element is a light emitting element.

15. An electrical/electronic device comprising:

a heat dissipation member;

a heat generation member; and a material for heat dissipation member bonding agent bonding the heat dissipation member to the heat generation member, the material having the thermosetting resin composition according to claim 1.

* * * * *